United States Patent
Kohmura et al.

(10) Patent No.: US 10,585,348 B2
(45) Date of Patent: Mar. 10, 2020

(54) PELLICLE, PELLICLE PRODUCTION METHOD AND EXPOSURE METHOD USING PELLICLE

(71) Applicant: MITSUI CHEMICALS, INC., Tokyo (JP)

(72) Inventors: Kazuo Kohmura, Chiba (JP); Daiki Taneichi, Otake (JP); Takashi Kozeki, Otake (JP); Yosuke Ono, Sodegaura (JP); Hisako Ishikawa, Ichihara (JP); Tsuneaki Biyajima, Otake (JP); Atsushi Okubo, Tokyo (JP); Yasuyuki Sato, Ibara (JP); Toshiaki Hirota, Ibara (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/454,631

(22) Filed: Mar. 9, 2017

(65) Prior Publication Data
US 2017/0184957 A1    Jun. 29, 2017

Related U.S. Application Data

(63) Continuation of application No. PCT/JP2015/076605, filed on Sep. 18, 2015.

(30) Foreign Application Priority Data

Sep. 19, 2014    (JP) ................................. 2014-192007

(51) Int. Cl.
G03F 1/62    (2012.01)
G03F 1/64    (2012.01)
(Continued)

(52) U.S. Cl.
CPC ................. *G03F 1/64* (2013.01); *G03F 1/14* (2013.01); *G03F 1/142* (2013.01); *G03F 1/62* (2013.01); *G03F 7/2008* (2013.01)

(58) Field of Classification Search
CPC ..... G03F 1/62; G03F 1/64; G03F 1/14; G03F 1/142; G03F 7/2008
See application file for complete search history.

(56) References Cited

U.S. PATENT DOCUMENTS

| | | |
|---|---|---|
| 5,604,955 A | 2/1997 | Horan |
| 6,300,019 B1 | 10/2001 | Ikeda et al. |

(Continued)

FOREIGN PATENT DOCUMENTS

| | | |
|---|---|---|
| CN | 101354527 A | 1/2009 |
| CN | 101930164 A | 12/2010 |

(Continued)

OTHER PUBLICATIONS

Machine translation of JP 2000-292909 (2000).*

(Continued)

*Primary Examiner* — Martin J Angebrannt
(74) *Attorney, Agent, or Firm* — Buchanan, Ingersoll & Rooney PC

(57) ABSTRACT

Provided are a pellicle for extreme ultraviolet light lithography, a method for producing the same, and an exposure method. A pellicle according to the present invention includes a first frame having a pellicle film located thereon; a second frame supporting the first frame; a through-hole running through the first frame; and a filter covering the through-hole on the side of a surface of the first frame on which the pellicle film is located. The through-hole may run through the pellicle film; and the filter may be located on the pellicle film. The filter may be located, adjacent to the pellicle film, on the first frame.

17 Claims, 27 Drawing Sheets

(51) Int. Cl.
  *G03F 7/20* (2006.01)
  *G03F 1/00* (2012.01)

(56) References Cited

U.S. PATENT DOCUMENTS

| | | | | |
|---|---|---|---|---|
| 6,593,035 | B1* | 7/2003 | Levinson | G03F 1/62 |
| | | | | 428/14 |
| 9,703,187 | B2 | 7/2017 | Ono et al. | |
| 2003/0095245 | A1 | 5/2003 | Mishiro et al. | |
| 2003/0207182 | A1 | 11/2003 | Shirasaki | |
| 2005/0042524 | A1* | 2/2005 | Bellman | C23C 26/00 |
| | | | | 430/5 |
| 2008/0213679 | A1* | 9/2008 | Miyakawa | G03F 1/64 |
| | | | | 430/5 |
| 2008/0259291 | A1* | 10/2008 | Banine | G03F 7/70191 |
| | | | | 355/30 |
| 2009/0029268 | A1* | 1/2009 | Lin | G03F 1/64 |
| | | | | 430/5 |
| 2009/0274962 | A1* | 11/2009 | Kubota | B82Y 10/00 |
| | | | | 430/5 |
| 2009/0291372 | A1 | 11/2009 | Kubota et al. | |
| 2010/0323281 | A1 | 12/2010 | Sekihara | |
| 2010/0328635 | A1 | 12/2010 | Sekihara | |
| 2011/0207030 | A1* | 8/2011 | Shirasaki | G03F 1/62 |
| | | | | 430/5 |
| 2012/0107548 | A1 | 5/2012 | Sekihara | |
| 2013/0088699 | A1 | 4/2013 | Yakunin et al. | |
| 2013/0089814 | A1* | 4/2013 | Kim | G03F 1/64 |
| | | | | 430/5 |
| 2014/0065525 | A1* | 3/2014 | Yamada | G03F 1/142 |
| | | | | 430/5 |
| 2014/0106265 | A1 | 4/2014 | Sekihara | |
| 2014/0234756 | A1 | 8/2014 | Kinoshita | |
| 2014/0307237 | A1 | 10/2014 | Sekihara | |
| 2015/0168824 | A1* | 6/2015 | Sun | G03F 1/64 |
| | | | | 430/5 |
| 2016/0291460 | A1* | 10/2016 | Shirasaki | G03F 1/64 |
| 2017/0184956 | A1* | 6/2017 | Kohmura | G03F 1/64 |
| 2017/0184957 | A1 | 6/2017 | Kohmura et al. | |
| 2017/0192349 | A1* | 7/2017 | Kohmura | G03F 1/62 |
| 2017/0212418 | A1* | 7/2017 | Kohmura | G03F 1/64 |
| 2017/0285461 | A1* | 10/2017 | Okubo | G03F 1/64 |
| 2018/0046071 | A1* | 2/2018 | Kohmura | G03F 1/24 |

FOREIGN PATENT DOCUMENTS

| | | | | |
|---|---|---|---|---|
| CN | 103246157 | A | 8/2013 | |
| CN | 103676460 | A | 3/2014 | |
| JP | 60-147737 | A | 8/1985 | |
| JP | 61-145936 | U | 9/1986 | |
| JP | 63-039703 | Y2 | 10/1988 | |
| JP | 02-62542 | A | 3/1990 | |
| JP | 03-42153 | A | 4/1991 | |
| JP | 04-093945 | * | 3/1992 | G03F 1/14 |
| JP | 05-107747 | A | 4/1993 | |
| JP | 05-113658 | A | 5/1993 | |
| JP | 08-160597 | * | 6/1996 | G03F 71/08 |
| JP | 10-48812 | A | 2/1998 | |
| JP | 2000-292909 | A | 10/2000 | |
| JP | 2001-312048 | A | 11/2001 | |
| JP | 2002-107914 | | 4/2002 | |
| JP | 2002-107915 | A | 4/2002 | |
| JP | 2014-160752 | A | 11/2002 | |
| JP | 2003-107678 | A | 4/2003 | |
| JP | 2004-258113 | A | 9/2004 | |
| JP | 2004-294786 | * | 10/2004 | G03F 1/14 |
| JP | 2004-354720 | A | 12/2004 | |
| JP | 2005-019822 | * | 1/2005 | G03F 1/14 |
| JP | 2005-250188 | * | 9/2005 | G03F 1/14 |
| JP | 2006-060037 | A | 3/2006 | |
| JP | 2006-163037 | A | 6/2006 | |
| JP | 2009-151335 | * | 7/2009 | G03F 1/14 |
| JP | 2009-282298 | A | 12/2009 | |
| JP | 2011-118117 | A | 6/2011 | |
| JP | 2012-151158 | A | 8/2012 | |
| JP | 2013-534727 | A | 9/2013 | |
| JP | 2014-049677 | A | 3/2014 | |
| JP | 2002-323752 | A | 9/2014 | |
| KR | 10-2001-0051502 | A | 6/2001 | |
| KR | 10-2003-0041811 | A | 5/2003 | |
| KR | 10-2012-0111997 | A | 10/2012 | |
| KR | 10-2013-0074066 | A | 7/2013 | |
| KR | 10-2014-0048794 | A | 4/2014 | |
| TW | 201224644 | A1 | 6/2012 | |
| WO | 02/057852 | A1 | 7/2002 | |
| WO | 2009/008294 | A1 | 1/2009 | |

OTHER PUBLICATIONS

Machine translation of JP 2004-354720 (2004).*
Machine transaltion of JP 60-147737 (1985).*
Schroff, et al., "EUV pellicle development for mask defect control". Proc. SPIE vol. 6151 article No. 615104 (10 pages) (2006).*
International Search Report (PCT/ISA/210) dated Dec. 9, 2015, by the Japanese Patent Office as the International Searching Authority for International Application No. PCT/JP2015/076605.
Written Opinion (PCT/ISA/237) dated Dec. 9, 2015, by the Japanese Patent Office as the International Searching Authority for International Application No. PCT/JP2015/076605.
Carmen Zoldesi et al., "Progress on EUV Pellicle development" Proceedings of SPIE, Feb. 23, 2014, 10 pages, vol. 9048, 90481N.

* cited by examiner

PELLICLE, PELLICLE PRODUCTION METHOD AND EXPOSURE METHOD USING PELLICLE

CROSS REFERENCE TO RELATED APPLICATIONS

This application is based upon and claims the benefit of priority from the prior Japanese Patent Application No. 2014-192007, filed on Sep. 19, 2014, and PCT Application No. PCT/JP2015/076605, filed on Sep. 18, 2015, the entire contents of which are incorporated herein by reference.

FIELD

The present invention relates to a pellicle usable for a photolithography process, a production method thereof, and an exposure method, and specifically, to a pellicle for extreme ultraviolet (EUV) lithography, a production method thereof, and an exposure method using the same.

BACKGROUND

In a photolithography process, in order to prevent dust or the like from being attached to a mask or a reticle, a pellicle having a pellicle film extended along one end of a frame of a size appropriate to enclose a mask pattern is used. In a state where such a pellicle is attached to the mask, the inside of the pellicle is highly airtight, and thus the pellicle film, which is thin, may sag or swell by a change in the air pressure or the temperature. When the pellicle film loses the flatness thereof in this manner, the optical characteristics of the pellicle film are changed. In the case where the pellicle film is protruded or recessed significantly, the pellicle film may contact the mask or hit the lid of a case accommodating the pellicle and thus is damaged.

As a solution to such a problem, Japanese Utility Model Publication for Opposition No. S63-39703, for example, describes a pellicle as described below. At least one vent hole is formed in a pellicle frame, and at the vent hole, a filter member inhibiting passage of dust or the like is provided in a space enclosed by a frame member, a mask substrate and a pellicle film so as not to come off. Japanese Laid-Open Patent Publication No. H05-113658 describes a pellicle in which a pellicle frame has an opening in at least a part of a side surface thereof and an inner surface thereof is pressure-sensitive. Japanese Laid-Open Patent Publication No. H05-107747 describes a pellicle including a cavity in a frame so as to capture foreign objects contained in gas passing the cavity.

Meanwhile, in a pellicle including a filter, the filter needs to have fine texture in order to capture microscopic dust or the like with certainty. This causes a problem that gas passes the filter at a low speed and thus it requires a long time to alleviate the pressure difference. In order to solve this, Japanese Laid-Open Patent Publication No. 2003-107678 describes a pellicle as described below. A pellicle frame is divided into an inner member and an outer member. The inner member is formed of natural color anodized aluminum or a ceramic material, which is highly lightfast, and the outer member is formed of aluminum alloy 7075-T6, which has a high proof stress. Two vent holes each having three bending portions are provided inside the pellicle frame, and a pressure sensitive layer for adsorbing dust is provided on an inner surface of the vent hole.

Currently, the wavelength used for lithography is progressively shortened, and EUV lithography has been developed as a next-generation lithography technology. EUV light refers to light of a wavelength in a soft X-ray region or a vacuum ultraviolet region, and is a light beam of about 13.5 nm±0.3 nm. In photolithography, the limit of pattern resolution is about ½ of the exposure wavelength. Even if an immersion method is used, the limit of pattern resolution is considered to be about ¼ of the exposure wavelength. Even if an immersion method with ArF laser (wavelength: 193 nm) is used, the exposure wavelength is expected to be about 45 nm at the minimum. Therefore, EUV lithography is expected as a revolutionary technology that realizes a significant size reduction as compared with the conventional lithography.

In the meantime, EUV light is easily absorbed to any substance. Therefore, in EUV lithography, the inside of an exposure device needs to be in vacuum. EUV light has a refractive index of close to 1 with respect to any substance. Therefore, a refraction optical system using a lens and a transmissive photomask is not usable unlike in the conventional lithography using visible light or ultraviolet light. For this reason, EUV lithography requires exposure to be performed in a reflection optical system using a reflective photomask and a mirror. As described in, for example, Japanese Laid-Open Patent Publication No. 2014-160752, a reflective photomask includes a multi-layer reflective film including a Mo layer and an Si layer stacked alternately a plurality of times on a substrate, and also includes an absorption layer, absorbing EUV light, provided on the reflective film.

SUMMARY

As described above, in EUV lithography, exposure is performed in vacuum, unlike in conventional lithography. Therefore, attachment of a pellicle to a photomask was considered as not being indispensable. However, it has been found that attachment of a pellicle to a photomask is indispensable because EUV lithography is an unconventionally microscopic process. Since EUV light is easily absorbed to any substance, the pellicle film located on a pellicle needs to be a film of a nanometer order, which is unconventional.

Since attachment of a pellicle to a photomask was first considered as not being indispensable, an EUV exposure device developed so far includes a space having a height of merely 2.5 mm for attaching a pellicle to a photomask. However, in order to provide, in an exposure device, a space having a height of 5 mm or greater for attaching a conventional pellicle, the design of the optical system needs to be significantly changed, which delays the development of EUV lithography.

Since the exposure is performed in vacuum, it is considered that the pellicle film may sag or swell. Since the space in which the pellicle is located is significantly restricted, a sufficient amount of air needs to be provided through a vent hole provided in a frame of the pellicle in order to prevent the pellicle film of a nanometer order from being damaged. The vent hole needs to be provided with a filter. Since the space in which the pellicle is located is significantly restricted, there is also a significant restriction on the height of the frame. Therefore, for attaching the filter to the frame, an unconventional design is necessary.

The present invention for solving the above-described problems has an object of providing a pellicle for extreme ultraviolet light lithography, a production method thereof, and an exposure method.

In a pellicle for extreme ultraviolet light lithography, a very thin pellicle film is bonded to a frame. Therefore, if the pellicle film is bonded to the photomask from above the frame with a force as conventionally done, the pellicle film may be broken. For this reason, the pellicle for extreme ultraviolet light lithography needs to be bonded to the photomask in a non-contact manner by use of a dedicated bonding device. Herein, the term "non-contact manner" indicates that no strong force is applied from above the frame, and the "strong force" is at least about 1 kgf, which is used for conventional bonding of a photomask. The present invention has, in addition to the above-described object, an object of providing a pellicle for extreme ultraviolet light lithography that is bondable to a photomask in a non-contact manner, and a production method thereof.

Provided in an embodiment according to the present invention is a pellicle including a first frame having a pellicle film located thereon; a second frame supporting the first frame; a through-hole running through the first frame; and a filter covering the through-hole on the side of a surface of the first frame on which the pellicle film is located.

In the above-described pellicle, the through-hole may run through the pellicle film; and the filter may be located on the pellicle film.

In the above-described pellicle, the filter may be located, adjacent to the pellicle film, on the first frame.

In the above-described pellicle, the filter may be located on the first frame such that a top surface of the filter and a top surface of the pellicle film are on the same plane.

In the above-described pellicle, the first frame may have a groove in a surface thereof facing the second frame, the groove being in communication with the through-hole; the groove, in combination with the second frame, may form a hole in communication with the through-hole; and the hole may have an opening in an inner surface of the first frame.

In the above-described pellicle, the second frame may have a first opening located in a surface thereof facing the first frame, and also has a second opening located in an inner surface thereof; the two openings may be in communication with each other via a hole located in the second frame; and the first opening may be in communication with the through-hole.

In the above-described pellicle, the second frame may have a groove in a surface thereof facing the first frame, the groove being in communication with the through-hole; the groove, in combination with the first frame, may form a hole in communication with the through-hole; and the hole may have an opening in an inner surface of the second frame.

In the above-described pellicle, the pellicle film may have a transmittance of 90.0% or greater with respect to light having a wavelength of 5 nm or longer and 30 nm or shorter and has a thickness of 20 nm or greater and 50 nm or less.

In the above-described pellicle, the pellicle may have a height of 2 mm or less.

Provided in an embodiment according to the present invention is a method for producing a pellicle including forming a pellicle film on a substrate; removing a part of the pellicle film at a predetermined position to expose the substrate; removing a part of the substrate to expose the pellicle film, thereby forming a first frame and forming a through-hole running through the first frame, the through-hole being formed at the predetermined position; locating a filter, covering the through-hole, on the side of a surface of the first frame on which the pellicle film is located; and securing the first frame to a second frame with an adhesive layer so as to open the through-hole on the side of the first frame.

In the above-described method for producing a pellicle, the through-hole may be formed at the predetermined position to run through the pellicle film; and the filter covering the through-hole may be located on the pellicle film.

In the above-described method for producing a pellicle, the filter may be located, adjacent to the pellicle film, on the first frame.

In the above-described method for producing a pellicle, the filter may be located on the first frame such that a top surface of the filter and a top surface of the pellicle film are on the same plane.

The above-described method for producing a pellicle may further include forming a groove, to be in communication with the through-hole, in a surface of the first frame that faces the second frame. The first frame may be secured to the second frame with the adhesive layer to communicate the groove with the through-hole and to form a hole having an opening in an inner surface of the first frame.

The above-described method for producing a pellicle may further include forming a first opening in a surface of the second frame that faces the first frame; forming a second opening in an inner surface of the second frame; forming a hole in the second frame, the hole communicating the two openings; and communicating the first opening with the through-hole.

The above-described method for producing a pellicle may further include forming a groove, to be in communication with the through-hole, in a surface of the second frame that faces the first frame. The first frame may be secured to the second frame with the adhesive layer to communicate the groove with the through-hole and to form a hole having an opening in an inner surface of the second frame.

In the above-described method for producing a pellicle, the pellicle film may be formed on the substrate so as to have a thickness of 20 nm or greater or 50 nm or less; and the pellicle film may have a transmittance of 90.0% or greater with respect to light having a wavelength of 5 nm or longer and 30 nm or shorter.

In the above-described method for producing a pellicle, the pellicle may have a height of 2 mm or less.

Provided is an exposure method including locating a pellicle according to any of the above on a reticle surface of a photomask; locating the photomask at a predetermined position in an exposure device and causing the pellicle to be accommodated in a gap having a distance of 3 mm or less from the reticle surface; directing, in vacuum, light having a wavelength of 5 nm or longer and 30 nm or shorter toward the photomask having the pellicle located thereon; and exposing light output from the reticle surface of the photomask having the pellicle located thereon toward a substrate having a resist layer formed thereon.

REFERENCE SIGNS LIST

Figure 1:
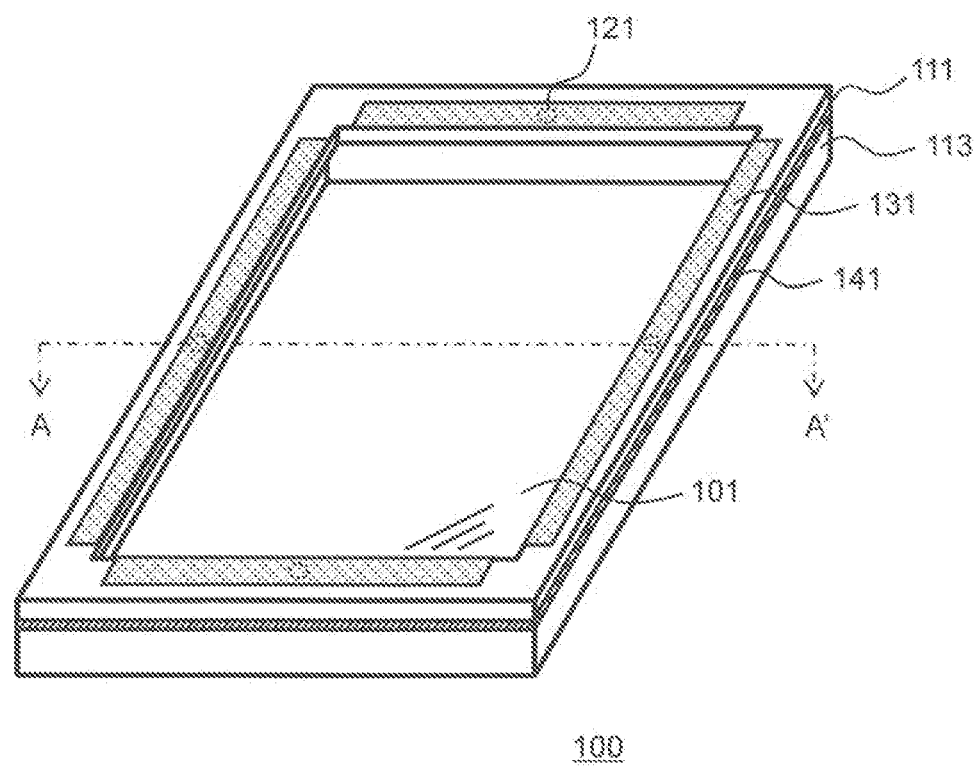
FIG. 1 is a schematic view (perspective view) of a pellicle 100 in an embodiment.

100: pellicle; 101; pellicle film; 105: substrate; 111: first frame; 113: second frame; 121: through-hole; 131: filter; 133: bonding portion; 135: gas passage portion; 137: adhesive layer; 141: adhesive layer; 143: adhesive layer; 151: liner; 200: pellicle; 201: pellicle film; 205: substrate; 211: first frame; 213: second frame; 221: through-hole; 223: hole; 225: groove; 231: filter; 243: adhesive layer; 251: liner; 300: pellicle; 301: pellicle film; 305: substrate; 311: first frame; 313: second frame; 321: through-hole; 331: filter; 341: adhesive layer; 343: adhesive layer; 351: liner; 400: pellicle; 401: pellicle film; 405: substrate; 411: first frame; 413: second frame; 421: through-hole; 431: filter; 441: adhesive layer; 443: adhesive layer; 451: liner; 500: pellicle; 501: pellicle film; 505: substrate; 511: first frame; 513: second frame; 521: through-hole; 523: hole; 525: groove; 531: filter; 543: adhesive layer; 551: liner; 600: pellicle; 601: pellicle film; 605: substrate; 611: first frame; 613: second frame; 621: through-hole; 623: first opening; 625: second opening; 627: hole; 631: filter; 643: adhesive layer; 651: liner; 700: pellicle; 701: pellicle film; 705: substrate; 711: first frame; 713: second frame; 721: through-hole; 723: first opening; 725: second opening; 727: hole; 731: filter; 743: adhesive layer; 751: liner; 800: pellicle; 801: pellicle film; 805: substrate; 811: first frame; 813: second frame; 821: through-hole; 823: hole; 831: filter; 841: adhesive layer; 843: adhesive layer; 851: liner; 900: pellicle; 901: pellicle film; 911: first frame; 913: second frame; 921: through-hole; 923: hole; 931: filter; 941: adhesive layer; 943: adhesive layer; 951: liner; 1000: pellicle; 1001: pellicle film; 1011: first frame; 1013: second frame; 1021: through-hole; 1023: hole; 1031: filter; 1041: adhesive layer; 1043: adhesive layer; 1051: liner; 1100: pellicle; 1101: pellicle film; 1111: first frame; 1113: second frame; 1121: through-hole; 1131: filter; 1141: adhesive layer; 1143: adhesive layer; 1151: liner; 5000: pellicle production device; 5100: vacuum chamber; 5200: table; 5110: supply tube; 5120A: discharge tube; 5120B: discharge tube; 6000: photomask production device; 6100: vacuum chamber; 6110: supply tube; 6120A: discharge tube; 6120B: discharge tube; 6500: photomask; 7000: photomask production device; 7100: vacuum chamber; 7110: supply tube; 7120A: discharge tube; 7120B: discharge tube; 7220A: discharge tube; 7220B: discharge tube; 7500: photomask; 1800: pellicle; 1801: pellicle film; 1811: first frame; 1813: second frame; 1821: through-hole; 1831: filter; 1841: adhesive layer; 1843: adhesive layer; 1851: liner; 1890: gap; 1900: pellicle; 1901: pellicle film; 1911: first frame; 1913: second frame; 1921: through-hole; 1941: adhesive layer; 1943: adhesive layer; 1951: liner; 1990: gap

DESCRIPTION OF EMBODIMENTS

In this specification, EUV light refers to light having a wavelength of 5 nm or longer and 30 nm or shorter. The wavelength of the EUV light is preferably about 5 nm to about 13.5 nm, and is more preferably 13.5±0.3 nm. EUV light is easily absorbed to any substance. Therefore, according to the present invention, a pellicle film needs to be a film of a nanometer order. The pellicle film according to the present invention has a transmittance of 90.0% or greater with respect to light having a wavelength of 5 nm or longer and 30 nm or shorter. The pellicle film according to the present invention has a transmittance of 90.0% or greater with respect to light having a wavelength of, preferably, about 5 nm to about 13.5 nm, more preferably 13.5±0.3 nm. In order to obtain such a transmittance, the pellicle film according to the present invention has a thickness of 10 nm or greater and 100 nm or less, preferably 10 nm or greater and 50 nm or less.

EUV transmittance T of a pellicle film is defined by the following expression (1).

$$T \equiv \frac{I}{I_0} \quad (1)$$

In expression (1), I is the transmitting light intensity, and $I_0$ is the incident light intensity. The transmitting light intensity I, the incident light intensity $I_0$, the thickness d of the pellicle film, the density ρ of the pellicle film, and the mass absorption coefficient μ of the pellicle film have the relationship represented by the following expression (2).

$$I = I_0 \exp(-\mu \rho d) \quad (2)$$

In expression (2), the density ρ is the density inherent to the material forming the pellicle film. The mass absorption coefficient μ in expression (2) is found as follows. In the case where the optical energy is greater than about 30 eV and the photon energy is sufficiently far from the atomic absorption edge, the mass absorption coefficient μ does not depend on the inter-atom bonding state or the like. The photon energy of a wavelength of 13.5 nm is around 92.5 eV, and is also sufficiently far from the atomic absorption edge. Therefore, the mass absorption coefficient μ does not depend on the inter-atom bonding state of a compound forming the pellicle film. Thus, the mass absorption coefficient μ of the pellicle film is found by the following expression (3) from the mass absorption coefficient $\mu_1$ of each of elements forming the pellicle film (1, 2, . . . , i) and the mass fraction $W_i$ of each element.

[Expression 3]

$$\mu = \mu_1 W_1 + \mu_2 W_2 + \ldots \mu_i W_i \quad (3)$$

$W_i$ is a value found by $W_1 = n_i A_i / \Sigma n_i A_i$. $A_i$ is the atomic weight of each element i, and $n_i$ is the number of atoms of each element i.

For the mass absorption coefficient $\mu_i$ of each element in expression (3), the values in the following reference document provided by Henke, et al. may be referred to. (B. L. Henke, E. M. Gullikson, and J. C. Davis, "X-Ray Interactions: Photoabsorption, Scattering, Transmission, and Reflection at E=50-30,000 eV, Z=1-92," At. Data Nucl. Data Tables 54, 181 (1993). The latest numerical values are described in http://www.cxro.lbl.gov/optical_constants/.)

Once the mass absorption coefficient μ, the density ρ and the thickness d of the pellicle film are specified, the transmittance of the pellicle film with respect to light having a wavelength of 13.5 nm is calculated based on expressions (1) and (2). The above transmittance is also calculated at the website regarding optical constants of the Center for X-Ray Optics in the Lawrence Berkeley National Laboratory.

In order to increase the thickness and also increase the transmittance, it is desirable to use a material having a low absorption coefficient as the material of the pellicle film. Specifically, it is desirable to use a material formed of an element having a mass absorption coefficient of 100 or less where the mass absorption coefficient μ of hydrogen is 1. Especially, it is desirable to use an element such as H, Be, B, C, N, O, Si, P, S, Cl, K, Ca, Sc, Br, Rb, Sr, Y, Zr, Nb, Mo, Tc, Ru, or the like.

Examples of the practical compound forming the pellicle film include polymer compounds such as fluorine-based polymer, polyolefin, polyimide and the like, metal materials such as ruthenium, nickel, zirconium, titanium, molybdenum, niobium, and the like; crystalline silicon (e.g., single crystalline silicon, polycrystalline silicon, etc.); amorphous silicon, diamond-like carbon (DLC), graphite; amorphous carbon; graphene; silicon carbide; silicon nitride; and the like.

The pellicle film may include an antioxidant film or a heat radiation film. The antioxidant film may be formed of, for example, $SiO_x$ (x≤2), $Si_xN_y$ (x/y=0.7 to 1.5), SiON, SiC, $Y_2O_3$, YN, Mo, Ru or Rh.

The heat radiation film is preferably formed of a material having a high thermal radiation ratio or thermal conductivity. Specifically, the heat radiation film may be formed of, for example, any of substantially the same materials as those of the antioxidant film, Rb, Sr, Y, Zr, Nb, graphite, graphene or the like. The antioxidant film and the heat radiation film may be formed on one surface, or both of two surfaces, of the pellicle film. The pellicle film may contain a single element or compound, or two or more elements or compounds.

A conventional pellicle for ArF lithography includes a frame formed of aluminum, a ceramic material or the like, and the pellicle film is bonded to the frame with an adhesive layer. However, the pellicle film according to the present invention for EUV lithography is a very thin film having a thickness of 20 nm or greater and 50 nm or less. Therefore, it is difficult to secure the pellicle film to the frame by bonding. Thus, a semiconductor production process may be used. A pellicle film is formed on a substrate by, for example, vapor deposition. The substrate is back-etched into a frame shape to expose the pellicle film. In this manner, a frame having a pellicle film located thereon is obtained. The substrate according to the present invention may be, for example, a silicon substrate, a sapphire substrate, a silicon carbide substrate or the like. The substrate is not limited to any of these, but is preferably a silicon substrate, a sapphire substrate, or a silicon carbide substrate, and is more preferably a silicon substrate.

As described above, the space for attaching a pellicle to a photomask has a height of merely 2.5 mm. In order to prevent breakage of the pellicle film, the height of the pellicle is preferably 2 mm or less. In the case where a very thin pellicle film is formed by the above-described method, it is difficult to form a through-hole as a vent hole in a side surface of the frame. According to a conceivable method, a first frame having a pellicle film located thereon and a second frame having a through-hole formed in a side surface thereof are separately formed, and are bonded to each other with an adhesive layer. The first frame preferably has a thickness of 1 mm or less from the point of view of formation of the pellicle film and ease of handling, but it is difficult to form the first frame to have a thickness of 100 µm or less. The pellicle includes the adhesive layer for bonding the first frame and the second frame and also an adhesive layer for bonding the pellicle and the mask, and therefore, the second frame having a through-hole is permitted to have a thickness of 1 to 1.5 mm at the maximum. In the case where the through-hole is covered with a filter to protect the through-hole against dust, it is difficult to locate the filter of 1.5 mm or less on a side surface of the second frame from the point of view of adhesiveness or ease of handling.

Figure 27A:
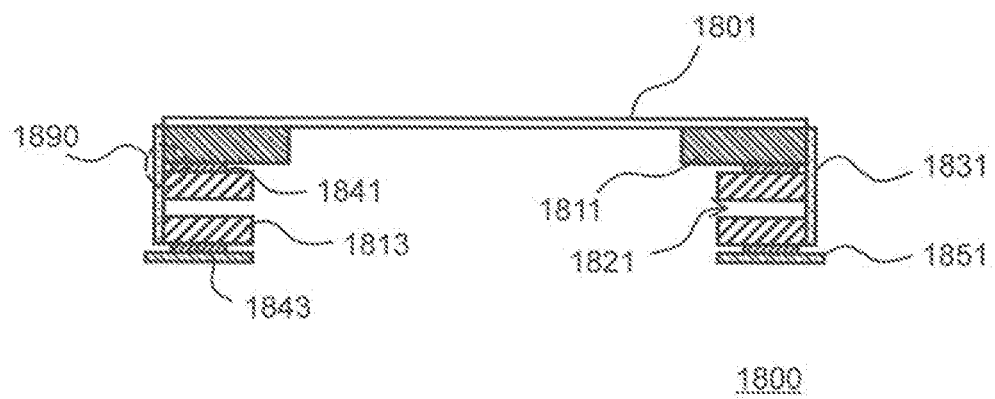
FIG. 27A shows an example examined in an embodiment and is a cross-sectional view of a pellicle 1800.
Figure 27B:
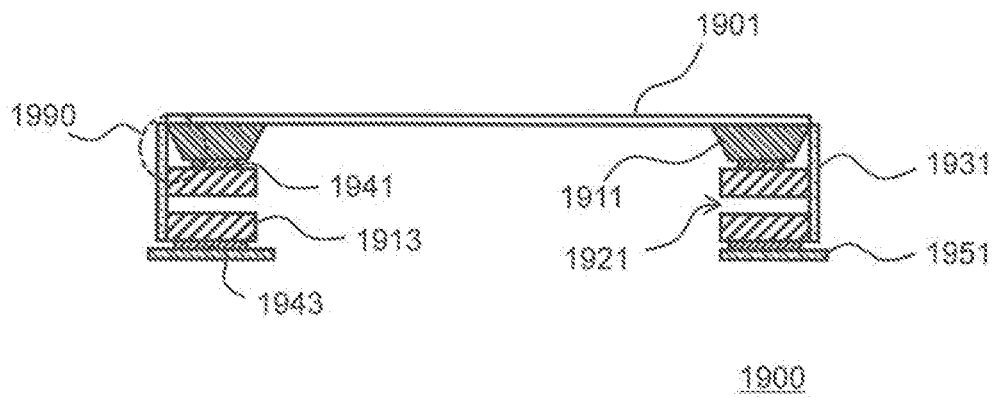
FIG. 27B is a cross-sectional view of a pellicle 1900.

Under such circumstances, it is conceivable to locate a filter of about 2 mm on a side surface of the first frame and the second frame bonded together with an adhesive layer. In this case, however, a problem shown in FIGS. 27A and 27B is caused. FIGS. 27A and 27B provide schematic views of a pellicle including a filter of about 2 mm on a side surface of a first frame and a second frame bonded together with an adhesive layer. FIG. 27A is a schematic view of a pellicle 1800 including a first frame formed by dry etching. FIG. 27B is a schematic view of a pellicle 1900 including a first frame formed by wet etching.

The pellicle 1800 includes a first frame 1811 having a pellicle film 1801 located thereon, and a second frame 1813 secured to the first frame 1811 with an adhesive layer 1841. The second frame 1813 has a through-hole 1821 running through an outer side surface and an inner side surface thereof. On a side surface of the first frame 1811 and the second frame 1813 bonded together with the adhesive layer 1841, a filter 1831 covering the through-hole 1821 is bonded with an adhesive layer (not shown). An adhesive layer 1843 used to secure the pellicle 1800 to a photomask is formed on a bottom surface of the second frame 1813. Until the pellicle 1800 is secured to the photomask, the adhesive layer 1843 is protected by a liner 1851. In this state, a gap 1890 is formed at the adhesive layer 1841 bonding the first frame 1811 and the second frame 1813 to each other.

Such a gap formed on a rear surface (bonding surface) of the filter is conspicuous in the case where the first frame is formed by wet etching. The pellicle 1900 includes a first frame 1911 having a pellicle film 1901 located thereon, and a second frame 1913 secured to the first frame 1911 with an adhesive layer 1941. The second frame 1913 has a through-hole 1921 running through an outer side surface and an inner side surface thereof. On a side surface of the first frame 1911 and the second frame 1913 bonded together with the adhesive layer 1941, a filter 1931 covering the through-hole 1921 is bonded with an adhesive layer (not shown). An adhesive layer 1943 used to secure the pellicle 1900 to a photomask is formed on a bottom surface of the second frame 1913. Until the pellicle 1900 is secured to the photomask, the adhesive layer 1943 is protected by a liner 1951. In the pellicle 1900, the first frame 1911 is formed by wet etching. Therefore, as shown in FIG. 27B, the side surface of the first frame 1911 is inclined, and the first frame 1911 has a trapezoidal cross-section. In this state, a gap 1990 is formed between the first frame 1911 and the adhesive layer 1941, and thus the filter 1931 is not sufficiently close-adhesive.

Thus, the present inventors made studies regarding a structure of a pellicle having a sufficient close-adhesiveness with no gap being formed on a rear surface of the filter. Hereinafter, a pellicle, a method for producing the same, and an exposure method according to the present invention will be described with reference to the figures. It should be noted that the pellicle, and the method for producing the same according to the present invention may be carried out in various embodiments, and should not be construed as being limited to any of the following embodiments. In the figures referred to regarding the embodiments, the same elements or elements having substantially the same functions will bear the same reference signs, and repeated descriptions will be omitted.

The pellicle according to the present invention includes a first frame having a pellicle film located thereon, a second frame supporting the first frame, a through-hole running through the first frame, and a filter covering the through-hole on the side of a surface of a first frame on which the pellicle film is located. Hereinafter, the pellicle according to the present invention will be described by way of specific embodiments.

Embodiment 1

Figure 2A:
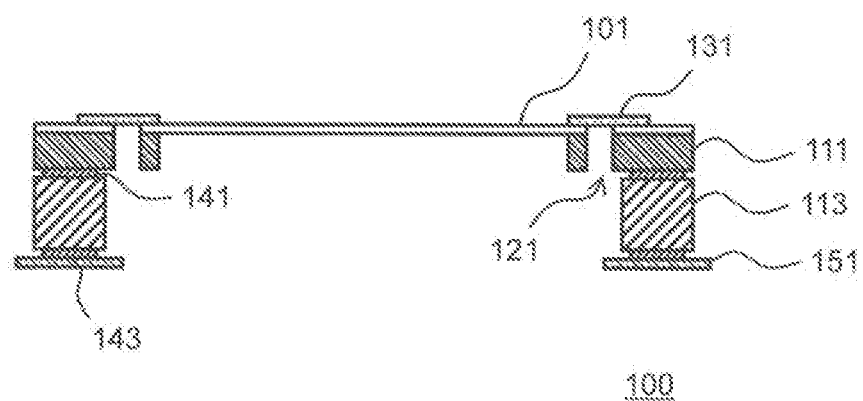
FIG. 2A provides cross-sectional views of the pellicle 100 in an embodiment, taken along line A-A' in FIG. 1.
Figure 2B:
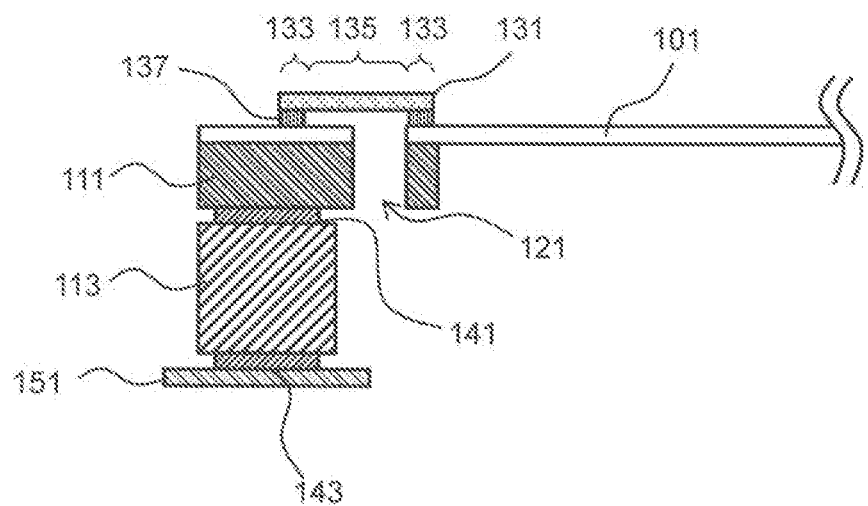
FIG. 2B is a partial enlarged view of FIG. 2A.

FIG. 1 is a schematic view (perspective view) of a pellicle 100 in an embodiment according to the present invention. FIGS. 2A and 2B provide cross-sectional views of the pellicle 100 taken along line A-A' in FIG. 1. FIG. 2A is a cross-sectional view of the pellicle 100 taken along line A-A' in FIG. 1, and FIG. 2B is a partial enlarged view of FIG. 2A. The pellicle 100 includes a first frame 111 having a pellicle film 101 located thereon, and a second frame 113 supporting the first frame 111. The pellicle 100 also has a through-hole 121 running through the pellicle film 101 and the first frame 111, and includes a filter 131 located on the pellicle film 101 and covering the through-hole 121 (FIG. 2A). The filter 131 is located in a region on the pellicle film 101 on the first frame 111 with an adhesive layer 137 (FIG. 2B). In FIGS. 2A and 2B, the second frame 113 is provided on a surface of the first frame 111 that is opposite to a surface on which the pellicle film 101 is located. Alternatively, the second frame 113 may be provided on a side surface of the frame 111.

As the pellicle film 101 and the first frame 111, the pellicle film and the substrate described above are usable. Thus, the pellicle film 101 and the first frame 111 will not be described in detail. The first frame 111 is formed of, preferably, silicon, sapphire or silicon carbide, more preferably silicon. The second frame 113 is preferably formed of a material that is tolerant to EUV light, is highly flat and is low ion-eluting. In order to remove stain derived from carbon, hydrogen gas is supplied to flow in an exposure device. Therefore, the second frame 113 is preferably formed of a material that is tolerant to hydrogen radicals.

There is no specific limitation on the material of the second frame 113 (pellicle frame), and may be formed of a material normally usable for a pellicle frame. Specific materials usable for the second frame 113 include aluminum, an aluminum alloy (5000 series, 6000 series, 7000 series, etc.), stainless steel, silicon, a silicon alloy, iron, an iron-based alloy, carbon steel, tool steel, a ceramic material, a metal-ceramic composite material, a resin, and the like. Among these materials, aluminum and an aluminum alloy, which are lightweight and rigid, are preferable. The second frame 113 may include a protective film at a surface thereof.

The protective film is preferably formed of a material that is tolerant to hydrogen radicals and EUV light present in the exposure atmosphere. An example of protective film is an oxide film. An oxide film may be formed by a known method such as anodization or the like.

The first frame 111 and the second frame 113 are secured to each other with an adhesive layer 141. Preferably, the adhesive layer 141 has a minimum possible thickness that guarantees a sufficient adhesiveness between the first frame 111 and the second frame 113. For example, the adhesive layer 141 has a thickness of 10 μm or greater and 300 μm or less. The adhesive layer 141 is preferably formed of an adhesive material that is tolerant to EUV light and does not generate much gas. In order to remove stain derived from carbon, hydrogen gas is supplied to flow in the exposure device. Therefore, the adhesive layer 141 is preferably formed of a material that is tolerant to hydrogen radicals.

In this specification, the term "adhesive" refers to an adhesive in a broad sense. The concept of the "adhesive" encompasses a pressure sensitive adhesive. Examples of the adhesive include an acrylic resin-based adhesive, an epoxy resin-based adhesive, a polyimide resin-based adhesive, a silicone resin-based adhesive, an inorganic adhesive, two-sided pressure sensitive adhesive tape, a silicone resin-based pressure sensitive adhesive, an acrylic resin-based pressure sensitive adhesive, a polyolefin-based pressure sensitive adhesive, and the like.

Preferable examples of the adhesive usable for bonding the pellicle film or another frame include an acrylic resin-based adhesive, an epoxy resin-based adhesive, a polyimide resin-based adhesive, a silicone resin-based adhesive, and an inorganic adhesive. Preferable examples of the adhesive usable for bonding a photomask include two-sided pressure sensitive adhesive tape, a silicone resin-based pressure sensitive adhesive, an acrylic resin-based pressure sensitive adhesive, and a polyolefin-based pressure sensitive adhesive.

The through-hole 121 is provided so as to run through the pellicle film 101 and the first frame 111. The through-hole 121 has such a diameter that, when the pressure is decreased from normal pressure (0.1 MPa) to a vacuum state at the time of exposure ($10^{-4}$ to $10^{-6}$ Pa), suppresses the expansion of the pellicle film 101, by a pressure difference between the inside and the outside of the pellicle 100, to less than 0.5 mm. In this embodiment, the diameter of the through-hole 121 is set in consideration of the upper limit of the pressure loss caused at the through-hole 121 when the pressure is decreased.

The pressure loss caused at the through-hole when the pressure is decreased is desirably 1 Pa or less, more desirably 0.5 Pa or less. It is preferable that the filter 131 is located to cover the through-hole 121, so that when the pressure is decreased, a majority of the pressure loss is caused at the filter 131 whereas almost no pressure loss is caused at the through-hole 121. For example, the size and the number of the through-holes 121 are adjusted such that the pressure loss at the through-holes 121 is 1 Pa or less, preferably about 0.1 Pa.

In the case where, for example, the pressure is decreased at a rate of 350 Pa/sec., when the pressure loss caused at the through-hole 121, i.e., the pressure difference between the inside and the outside of the pellicle 100, is 1 Pa, the number of the through-holes 121 is 4 and the diameter of each through-hole 121 is 400 μm, or the number of the through-holes 121 is 40 and the diameter of each through-hole 121 is 300 μm. The through-holes 121 may have any shape with no specific limitation, and may be circular, elliptical, rectangular, polygonal, trapezoidal or the like. There is no specific limitation on the diameter of the through-holes 121, but it is desirable that the through-holes 121 each have a diameter of about 10 to about 500 μm as long as the strength of the first frame is not decreased. There is no specific limitation on the number of the through-holes 121, and the number of the through-holes 121 may be selected in accordance with the length or the width of the filter. In the case where a plurality of through-holes 121 are provided, it is preferable that the through-holes 121 are located at an equal interval in the filter 131 although there is no specific limitation on the positions of the through-holes 121 or the interval between the through-holes 121.

In the state where the pellicle 100 is located on the photomask, the width of the first frame 111 influences the aperture ratio of the pellicle 100. Especially in EUV lithography using a reflective mask, EUV light is incident in an inclining manner with respect to the photomask and is reflected, and thus the width of the first frame 111 is preferably smaller. Therefore, in this embodiment, it is preferable that the through-hole 121 is located close to an inner surface of the second frame 113.

Desirably, the filter 131 is formed of a material that prevents dust or the like from flowing into the pellicle 100 secured to the photomask, and has an initial pressure loss of 100 Pa or greater and 550 Pa or less and a particle capture rate of 99.7% or greater and 100% or less for particles having a particle diameter of 0.15 μm or greater and 0.3 μm or less. The filter 131 may be, for example, a ULPA filter (Ultra Low Penetration Air Filter). A ULPA filter is an air filter having a particle capture rate of 99.9995% or greater at rated flow for particles having a particle diameter of 0.15 μm and an initial pressure loss of 245 Pa or less. The filter 131 may be a HEPA filter (High Efficiency Particulate Air Filter). A HEPA filter is an air filter having a particle capture rate of 99.97% or greater at rated flow for particles having a particle diameter of 0.3 μm and an initial pressure loss of 245 Pa or less. Preferably, the filter 131 has a width of 1 mm or greater and 4 mm or less in order to guarantee the adhesiveness with the pellicle film 101 and a certain level of aperture ratio of the pellicle 100.

The filter 131 includes a gas passage portion 135 and a bonding portion 133 on which the adhesive layer 137 is located (FIG. 2B). The bonding portion 133 is provided along the periphery of the filter 131 so as to enclose the gas passage portion 135. The adhesive layer 137 has a role of bonding the pellicle film 101 and the gas passage portion 135 to each other with no gap. The bonding portion 133 in contact with the adhesive layer 137 does not pass gas. The bonding portion 133 has a width of 0.2 mm or greater and 1.0 mm or less. In order to increase the area size of the gas passage portion 135, the bonding portion 133 is desirably as thin as possible. The gas passage portion 135 refers to a portion of the filter 131 that is not in contact with the adhesive layer 137. Gas passes the gas passage portion 135 and particles contained in the gas are captured. Since the pressure loss is caused at the gas passage portion 135, the ventilation performance of the filter is determined by the ventilation performance of the gas passage portion 135.

The total area size of the filter 131 is set in consideration of the upper limit of the pressure loss caused at the filter 131 when the pressure is decreased. The pressure loss caused at the filter 131 when the pressure is decreased is desirably 2 Pa or less. The length of the filter 131 is calculated by dividing the area size of the filter 131 by the width of the filter 131. There is no specific limitation on the length of each filter. The length of the filter is desirably 1 cm or greater and 15 cm or less, more desirably 2 cm or greater and 10 cm or less.

It is currently assumed that the pellicle for EUV exposure has a length of a longer side of 152 mm or less, a length of a shorter side of 120 mm or less, and a height of 2 mm or less, and is depressurized or pressurized at 350 Pa/sec. In order to realize a state where the expansion of the pellicle film 101 caused by the pressure difference between the inside and the outside of the pellicle 100 is less than 0.5 mm when the pressure is decreased from normal pressure (0.1 MPa) to a vacuum state at the time of exposure ($10^{-4}$ to $10^{-6}$ Pa), or when the pressure is returned from the vacuum state to normal pressure, it is preferable that the ratio of the total area size of the gas passage portion of the filter 131 with respect to the inner volume of the pellicle 100 (area size of the gas passage portion of the filter/inner volume of the pellicle) is 0.007 $mm^{-1}$ or greater and 0.026 $mm^{-1}$ or less. In the case where this ratio is 0.007 $mm^{-1}$ or greater, the flow rate of the gas passing the gas passage portion of the filter is not too high at the time of depressurization and pressurization. Therefore, the pressure difference between the inside and the outside of the pellicle 100 is suppressed from increasing, and thus the expansion of the pellicle film 101 is suppressed to less than 0.5 mm. In the case where this ratio is 0.026 $mm^{-1}$ or less, the gas passage portion 135 and the bonding portion 133 of the filter 131 each have a sufficiently large size despite the restriction on the size of the gas passage portion 135 that can be formed.

The thickness (height) of the filter needs to be determined such that the total of the height of the pellicle and the thickness (height) of the filter is less than 2.5 mm because the space for attaching the pellicle to the photomask has a height of merely 2.5 mm. Depending on the height of the pellicle, the thickness of the filter is preferably 0.05 mm or greater and 1.0 mm or less, and is more preferably 0.1 mm or greater and 0.4 mm or less.

An adhesive layer 143 is located on a bottom surface of the second frame 113. The adhesive layer 143 is an element used to secure the pellicle 100 to the photomask. The adhesive layer 143 preferably has a minimum possible thickness that guarantees a sufficient adhesiveness between the photomask and the second frame 113. The thickness of the adhesive layer 143 is, for example, 10 μm or greater and 300 μm or less. The adhesive layer 143 may be formed of an adhesive material that is tolerant to EUV light and does not generate much gas. In order to remove stain derived from carbon, hydrogen gas is supplied to flow in the exposure device. Therefore, the adhesive layer 143 is preferably formed of a material that is tolerant to hydrogen radicals.

Examples of the adhesive material include an acrylic resin-based adhesive, an epoxy resin-based adhesive, a polyimide resin-based adhesive, a silicone resin-based adhesive, an inorganic adhesive, two-sided pressure sensitive adhesive tape, a silicone resin-based pressure sensitive adhesive, an acrylic resin-based pressure sensitive adhesive, a polyolefin-based pressure sensitive adhesive, and the like. The material of the adhesive layer 143 may be the same as, or different from, the material of the adhesive 141.

Regarding the pellicle 100, it is preferable that the total height of the pellicle film 101, the first frame 111, the adhesive layer 141, the second frame 113 and the adhesive layer 143 is 2 mm or less. As described above, the space for attaching the pellicle to the photomask has a height of merely 2.5 mm. Therefore, in order to prevent breakage of the pellicle film 101, the height of the pellicle 100 is preferably 2 mm or less.

In order to prevent dust or the like from being attached to the adhesive layer 143 of the pellicle 100 before use, the adhesive layer 143 is protected by a peelable liner 151.

According to the present invention, the through-hole 121 runs through the pellicle film 101 and the first frame, and the filter 131 is located on a region in the first frame 111 where the pellicle film 101 is provided. Thus, the filter 131 is located with a sufficient close-adhesiveness with no gap, other than the through-hole 121, being formed in a rear surface of the filter 131.

(Method for Producing the Pellicle 100)

Figure 3A:
FIG. 3A shows production steps of the pellicle 100 in an embodiment.

The pellicle 100 in this embodiment may be produced by, for example, a method described below with reference to FIGS. 3A to 3D and FIGS. 4A to 4C. The following production process is an example, and the order of production steps may be changed when necessary. FIGS. 3A to 3D and FIGS. 4A to 4C show the production steps of the pellicle 100. A substrate 105 is prepared, and the pellicle film 101 is formed on the substrate 105 (FIG. 3A). As described above, the substrate 105 may be, for example, a silicon substrate, a sapphire substrate, a silicon carbide substrate or the like, but is not limited to any of these.

The pellicle film 101 is formed by vapor deposition on the substrate 105 so as to have a thickness of 20 nm or greater and 50 nm or less. EUV light is easily absorbed to any substance. Therefore, it is preferable that the pellicle film 101 is formed to be thin so as to have a transmittance of 90.0% or greater with respect to light having a wavelength of 5 nm or longer and 30 nm or shorter. The pellicle film 101 according to the present invention has a transmittance of 90.0% or greater with respect to light having a wavelength of, preferably, about 5 nm to about 13.5 nm, more preferably 13.5±0.3 nm.

Figure 3B:
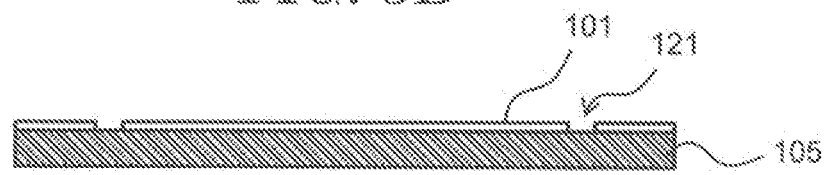
FIG. 3B shows production steps of the pellicle 100 in an embodiment.
Figure 3C:
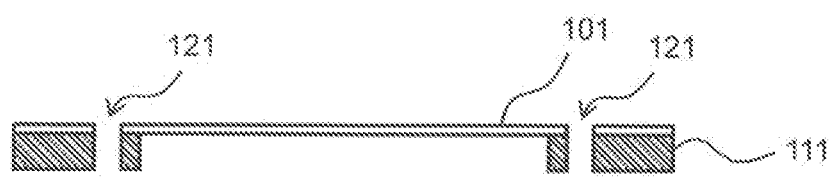
FIG. 3C shows production steps of the pellicle 100 in an embodiment.

The pellicle film 101 is etched to remove a part thereof at a predetermined position where the through-hole 121 is to be formed, and thus the substrate 105 is exposed (FIG. 3B). A surface of the substrate 105 that is opposite to a surface on which the pellicle film 101 is formed is etched to remove a part of the substrate 105 and thus to expose the pellicle film 101. In this manner, the first frame 111 is formed. The through-hole 121 running through the pellicle film 101 and the first frame 111 is formed at the predetermined position where the pellicle film 101 has been removed (FIG. 3C).

The through-hole 121 has such a diameter that, when the pressure is decreased from normal pressure (0.1 MPa) to a vacuum state at the time of exposure ($10^{-4}$ to $10^{-6}$ Pa), suppresses the expansion of the pellicle film 101, by a pressure difference between the inside and the outside of the pellicle 100, to less than 0.5 mm. In this embodiment, since the through-hole 121 is covered with the filter 131, the diameter of the through-hole 121 is set in consideration of the resistance of the filter 131.

As described above, in the state where the pellicle 100 is located on the photomask, the width of the first frame 111 influences the aperture ratio of the pellicle 100. Especially in EUV lithography using a reflective mask, EUV light is incident in an inclining manner with respect to the photomask and is reflected, and thus the width of the first frame 111 is preferably smaller. Therefore, in this embodiment, it is preferable that the through-hole 121 is located close to the inner surface of the second frame 113.

Figure 3D:
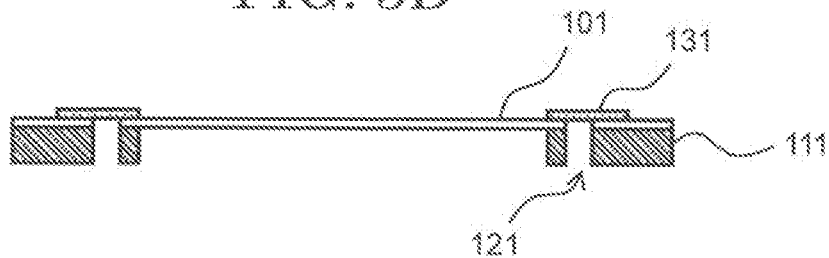
FIG. 3D shows production steps of the pellicle 100 in an embodiment.

The filter 131 covering the through-hole 121 is bonded onto the pellicle film 101 (FIG. 3D). The filter 131 preferably has the above-described properties, and preferably has a width of 1 mm or greater and 4 mm or less in order to guarantee the adhesiveness with the pellicle film 101 and a certain level of aperture ratio of the pellicle 100. There is no specific limitation on the timing when the filter 131 is bonded. The filter 131 may be bonded after the first frame 111 is secured to the second frame.

Figure 4A:
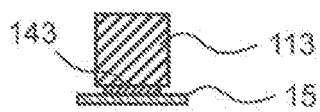
FIG. 4A shows production steps of the pellicle 100 in an embodiment.
Figure 4A:

Separately from the above, the second frame 113 is prepared. The adhesive layer 143 is formed on the bottom surface of the second frame 113. The liner 151 protecting the adhesive layer 143 is located (FIG. 4A). In this step, the liner 151 having the adhesive layer 143 formed thereon may be prepared and bonded to the bottom surface of the second frame 113 such that the liner 151 is bonded to the bottom surface with the adhesive layer 143.

Figure 4B:
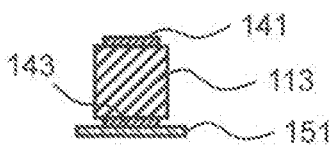
FIG. 4B shows production steps of the pellicle 100 in an embodiment.
Figure 4B:
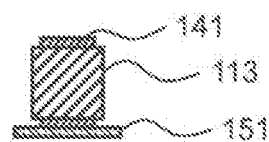
Figure 4C:
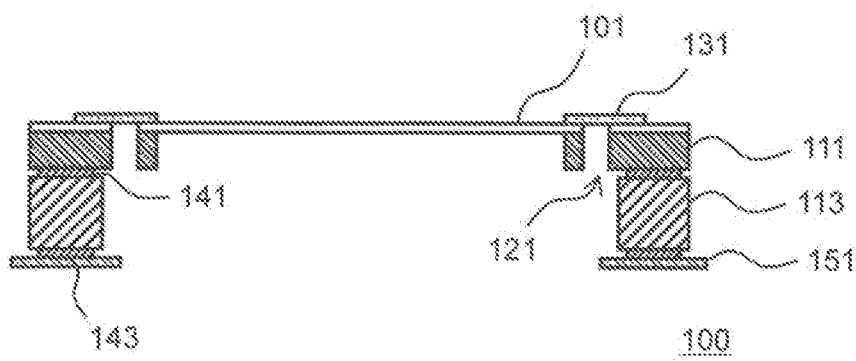
FIG. 4C shows production steps of the pellicle 100 in an embodiment.

The adhesive layer 141 is formed on a top surface of the second frame 113 (FIG. 4B). The first frame 111 is secured to the second frame 113 with the formed adhesive layer 141 (FIG. 4C). In this step, the first frame 111 is secured to the second frame 113 with the adhesive layer 141 such that the through-hole 121 is open on the side of the first frame 111.

Since the space for attaching the pellicle to the photomask has a height of merely 2.5 mm, it is preferable in this embodiment that the total height of the filter 131, the pellicle film 101, the first frame 111, the adhesive layer 141, the second frame 113 and the adhesive layer 143 is 2 mm or less.

According to the present invention, the through-hole 121 runs through the pellicle film 101 and the first frame, and the filter 131 is located on a region in the first frame 111 where the pellicle film 101 is provided. Thus, the filter 131 is located with a sufficient close-adhesiveness with no gap, other than the through-hole 121, being formed in the rear surface of the filter 131.

Embodiment 2

In the pellicle 100 in embodiment 1, the through-hole 121 is located inner to the second frame 113. This requires the first frame 111 to be wider than the second frame 113. As described above, in the state where the pellicle is located on the photomask, the width of the first frame influences the aperture ratio of the pellicle. In this embodiment, an example in which the through-hole is located with the width of the first frame being decreased will be described.

Figure 5:
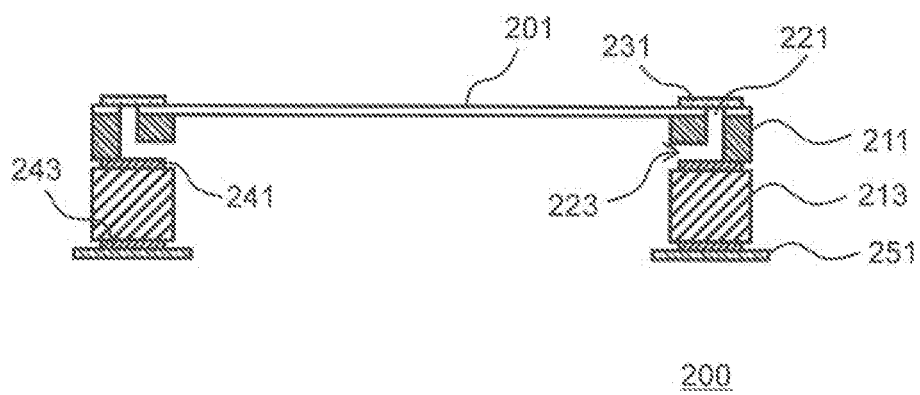
FIG. 5 is a cross-sectional view of a pellicle 200 in an embodiment, taken along line A-A' in FIG. 1.

FIG. 5 is a cross-sectional view of a pellicle 200 in an embodiment according to the present invention, taken along line A-A' in FIG. 1. The pellicle 200 includes a first frame 211 having a pellicle film 201 located thereon, and a second frame 213 supporting the first frame 211. The pellicle 200 also has a through-hole 221 running through the pellicle film 201 and the first frame 211, and includes a filter 231 located on the pellicle film 201 and covering the through-hole 221.

In this embodiment, the first frame 211 has a groove 225, in communication with the through-hole 221, in a surface thereof facing the second frame 213. The groove 225, in combination with the second frame 213, forms a hole 223 in communication with the through-hole 221. The hole 223 has an opening in an inner surface of the first frame 211. The filter 231 is located, with an adhesive layer (not shown), on a region in the first frame 211 where the pellicle film 201 is provided.

The pellicle film 201, the first frame 211 and the second frame 213 may be formed of any of substantially the same materials as those of the pellicle film, the substrate and the second frame 113 described above, and the materials will not be described in detail.

The first frame 211 and the second frame 213 are secured to each other with an adhesive layer 241. Preferably, the adhesive layer 241 has a minimum possible thickness that guarantees a sufficient adhesiveness between the first frame 211 and the second frame 213. For example, the adhesive layer 241 has a thickness of 10 μm or greater and 300 μm or less. The adhesive layer 241 may be formed of any of substantially the same adhesive materials as those of the adhesive layer 141, and the materials will not be described in detail.

The through-hole 221 is provided so as to run through the pellicle film 201 and the first frame 211. In this embodiment, the groove 225 in communication with the through-hole 221 is located in the surface of the first frame 211 that faces the second frame 213, so that a combination of the groove 225 and the second frame 213 forms the hole 223 in communication with the through-hole 221. Therefore, the through-hole 221, and the hole 223 communicating the through-hole 221 and the opening formed in the inner surface of the first frame 211, each have such a diameter that, when the pressure is decreased from normal pressure (0.1 MPa) to a vacuum state at the time of exposure ($10^{-4}$ to $10^{-6}$ Pa), suppresses the expansion of the pellicle film 201, by a pressure difference between the inside and the outside of the pellicle 200, to less than 0.5 mm. In this embodiment, since the through-hole 221 is covered with the filter 231, the diameter of the through-hole 221 and the hole 223 is set in consideration of the upper limit of the pressure loss caused at the through-hole 221 when the pressure is decreased.

The pressure loss caused at the through-hole when the pressure is decreased is desirably 1 Pa or less, more desirably 0.5 Pa or less. It is preferable that the filter 231 is located to cover the through-hole 221, so that when the pressure is decreased, a majority of the pressure loss is caused at the filter 231 whereas almost no pressure loss is caused at the through-hole 221. For example, the size the through-hole 221 is adjusted such that the pressure loss at the through-hole 221 is 1 Pa or less, preferably about 0.1 Pa.

In the case where, for example, the pressure is decreased at a rate of 350 Pa/sec., when the number of the through-holes 221 is 4 and the diameter of each through-hole 221 is 480 μm, the pressure loss caused at the through-hole 221, i.e., the pressure difference between the inside and the outside of the pellicle 200, is 1 Pa or less. The through-holes 221 may have any shape with no specific limitation, and may be circular, elliptical, rectangular, polygonal, trapezoidal or the like. There is no specific limitation on the diameter of the through-holes 221, but it is desirable that the through-holes 221 each have a diameter of about 10 to about 500 μm as long as the strength of the first frame or the film is not decreased. There is no specific limitation on the number of the through-holes 221, and the number of the through-holes 221 may be selected in accordance with the length or the width of the filter.

The filter 231 may be formed of any of substantially the same materials as those of the filter 131, and the materials will not be described in detail. Preferably, the filter 231 has a width of 1 mm or greater and 4 mm or less in order to guarantee the adhesiveness with the pellicle film 201 and a certain level of aperture ratio of the pellicle 200. It is sufficient that the width of the filter 231 is within the width of the first frame 211.

The total area size of the filter is set in consideration of the upper limit of the pressure loss caused at the filter 231 when the pressure is decreased. The pressure loss caused at the filter 231 when the pressure is decreased is desirably 2 Pa or less. The length of the filter 231 is calculated by dividing the area size of the filter 231 by the width of the filter 231. There is no specific limitation on the length of each filter. The length of the filter is desirably 1 cm or greater and 15 cm or less, more desirably 2 cm or greater and 10 cm or less. The thickness (height) of the filter needs to be determined such that the total of the height of the pellicle and the thickness (height) of the filter is less than 2.5 mm because the space for attaching the pellicle to the photomask has a height of merely 2.5 mm. Depending on the height of the pellicle, the thickness of the filter is preferably 0.05 mm or greater and 1.0 mm or less, and is more preferably 0.1 mm or greater and 0.4 mm or less.

An adhesive layer 243 is located on a bottom surface of the second frame 213. The adhesive layer 243 is an element used to secure the pellicle 200 to the photomask. The adhesive layer 243 preferably has a minimum possible thickness that guarantees a sufficient adhesiveness between the photomask and the second frame 213. The thickness of the adhesive layer 243 is, for example, 10 μm or greater and 300 μm or less. The adhesive layer 243 may be formed of any of substantially the same adhesive materials as those of the adhesive layer 143, and the materials will not be described in detail.

Regarding the pellicle 200, it is preferable that the total height of the pellicle film 201, the first frame 211, the adhesive layer 241, the second frame 213 and the adhesive layer 243 is 2 mm or less. As described above, the space for attaching the pellicle to the photomask has a height of merely 2.5 mm. Therefore, in order to prevent breakage of the pellicle film 201, the height of the pellicle 200 is preferably 2 mm or less.

In order to prevent dust or the like from being attached to the adhesive layer 243 of the pellicle 200 before use, the adhesive layer 243 is protected by a peelable liner 251.

According to the present invention, the through-hole 221 runs through the pellicle film 201 and the first frame 211, and a combination of the groove 225 in the first frame 211 and the second frame 213 forms the hole 223 in communication with the through-hole 221. Thus, the filter 231 is located with a sufficient close-adhesiveness with no gap, other than the through-hole 221, being formed in a rear surface of the filter 231.

(Method for Producing the Pellicle 200)

Figure 6A:
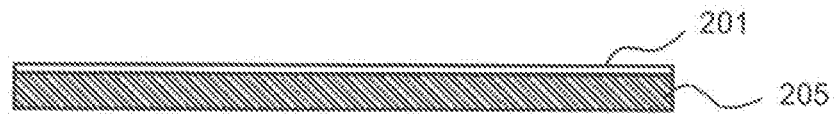
FIG. 6A shows production steps of the pellicle 200 in an embodiment.

The pellicle 200 in this embodiment may be produced by, for example, a method described below with reference to FIGS. 6A to 6D and FIGS. 7A to 7C. The following production process is an example, and the order of production steps may be changed when necessary. FIGS. 6A to 6D and FIGS. 7A to 7C show the production steps of the pellicle 200. A substrate 205 is prepared, and the pellicle film 201 is formed on the substrate 205 (FIG. 6A). As described above, the substrate 205 may be, for example, a silicon substrate, a sapphire substrate, a silicon carbide substrate or the like, but is not limited to any of these.

The pellicle film 201 is formed by vapor deposition on the substrate 205 so as to have a thickness of 20 nm or greater and 50 nm or less. EUV light is easily absorbed to any substance. Therefore, it is preferable that the pellicle film 201 is formed to be thin so as to have a transmittance of 90.0% or greater with respect to light having a wavelength of 5 nm or longer and 30 nm or shorter. The pellicle film 201 according to the present invention has a transmittance of 90.0% or greater with respect to light having a wavelength of, preferably, about 5 nm to about 13.5 nm, more preferably 13.5±0.3 nm.

Figure 6B:
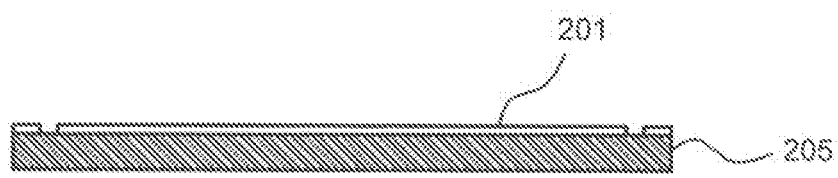
FIG. 6B shows production steps of the pellicle 200 in an embodiment.
Figure 6C:
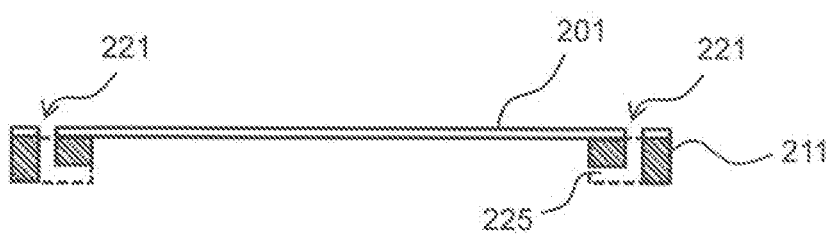
FIG. 6C shows production steps of the pellicle 200 in an embodiment.

The pellicle film 201 is etched to remove a part thereof at a predetermined position where the through-hole 221 is to be formed, and thus the substrate 205 is exposed (FIG. 6B). A surface of the substrate 205 that is opposite to a surface on which the pellicle film 201 is formed is etched to remove a part of the substrate 205 and to form the groove 225, which is to be in communication with the through-hole 221, in the surface of the first frame 211 that faces the second frame 213. The through-hole 221 running through the pellicle film 201 and the first frame 211 is formed at the predetermined position where the pellicle film 201 has been removed (FIG. 6C).

In this embodiment, the groove 225 in communication with the through-hole 221 is located in the surface of the first frame 211 that faces the second frame 213, so that a combination of the groove 225 and the second frame 213 forms the hole 223 in communication with the through-hole 221. Therefore, the through-hole 221 and the hole 223 each have such a diameter that, when the pressure is decreased from normal pressure (0.1 MPa) to a vacuum state at the time of exposure ($10^{-4}$ to $10^{-6}$ Pa), suppresses the expansion of the pellicle film 201, by a pressure difference between the inside and the outside of the pellicle 200, to less than 0.5 mm. In this embodiment, since the through-hole 221 is covered with the filter 231, the diameter of the through-hole 221 and the hole 223 is set in consideration of the resistance of the filter 231.

Figure 6D:
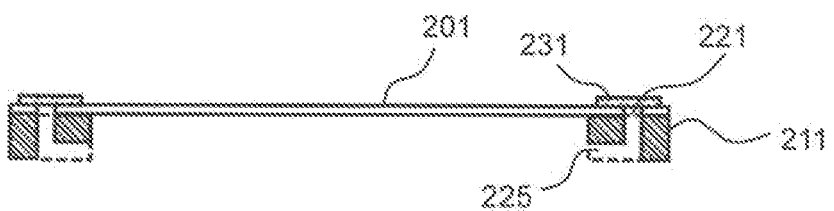
FIG. 6D shows production steps of the pellicle 200 in an embodiment.

The filter 231 covering the through-hole 221 is bonded onto the pellicle film 201 (FIG. 6D). The filter 231 preferably has the above-described properties, and preferably has a width of 1 mm or greater and 4 mm or less in order to guarantee the adhesiveness with the pellicle film 201 and a certain level of aperture ratio of the pellicle 200. There is no specific limitation on the timing when the filter 231 is bonded. The filter 231 may be bonded after the first frame 211 is secured to the second frame.

Figure 7A:
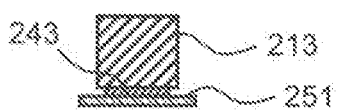
FIG. 7A shows production steps of the pellicle 200 in an embodiment.
Figure 7A:
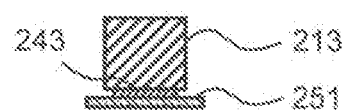

Separately from the above, the second frame 213 is prepared. The adhesive layer 243 is formed on the bottom surface of the second frame 213. The liner 251 protecting the adhesive layer 243 is located (FIG. 7A). In this step, the liner 251 having the adhesive layer 243 formed thereon may be prepared and bonded to the bottom surface of the second frame 213 such that the liner 251 is bonded to the bottom surface with the adhesive layer 243.

Figure 7B:
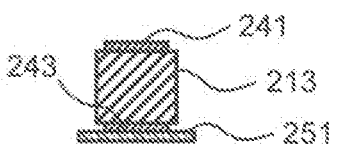
FIG. 7B shows production steps of the pellicle 200 in an embodiment.
Figure 7B:
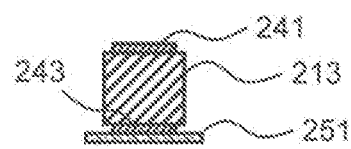
Figure 7C:
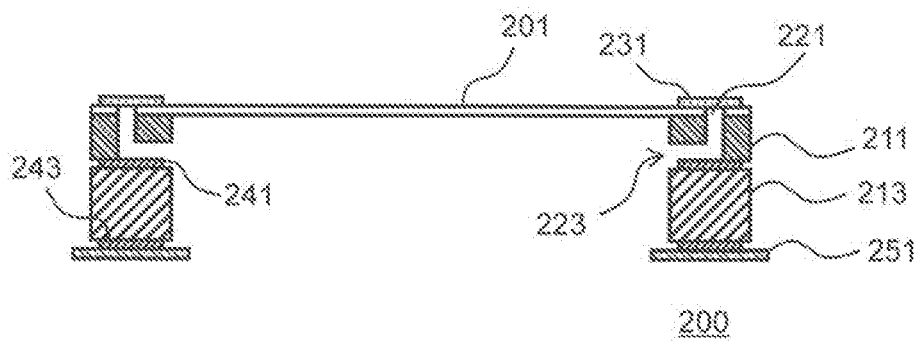
FIG. 7C shows production steps of the pellicle 200 in an embodiment.

The adhesive layer 241 is formed on a top surface of the second frame 213 (FIG. 7B). The first frame 211 is secured to the second frame 213 with the formed adhesive layer 241 (FIG. 7C). In this step, a combination of the groove 225 formed in the surface facing the second frame 213, and the second frame 213, forms the hole 223 in communication with the through-hole 221.

Since the space for attaching the pellicle to the photomask has a height of merely 2.5 mm, it is preferable in this embodiment that the total height of the filter 231, the pellicle film 201, the first frame 211, the adhesive layer 241, the second frame 213 and the adhesive layer 243 is 2 mm or less.

According to the present invention, the through-hole 221 runs through the pellicle film 201 and the first frame 211, and a combination of the groove 225 in the first frame 211 and the second frame 213 forms the hole 223 in communication with the through-hole 221. Thus, the filter 231 is located with a sufficient close-adhesiveness with no gap, other than the through-hole 221, being formed in the rear surface of the filter 231.

Embodiment 3

Figure 8:
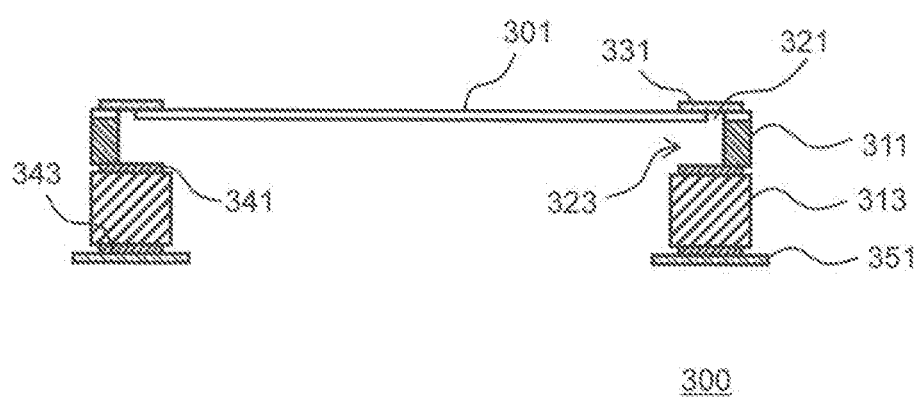
FIG. 8 is a cross-sectional view of a pellicle 300 in an embodiment, taken along line A-A' in FIG. 1.

In a modification of embodiment 2, a pellicle 300 in embodiment 3 will be described. FIG. 8 is a cross-sectional view of a pellicle 300 in an embodiment according to the present invention, taken along line A-A' in FIG. 1. Unlike in the pellicle 200 in embodiment 2, in the pellicle 300 in embodiment 3, a groove 325 in a first frame 311 is extended by etching to a position in contact with a pellicle film 301, and to form a hole 323 having a height approximately equal to the height of a through-hole 321. Except for the above, the pellicle 300 has substantially the same structure as that of the pellicle 200, and thus will not be described in detail.

In the pellicle 300, the through-hole 321 runs through the pellicle film 301 and the first frame 311, and the groove 325 in the first frame 311 is in direct communication with a second frame 313 to form the hole 323. Thus, the ventilation is significantly improved.

(Method for Producing the Pellicle 300)

Figure 9A:
FIG. 9A provides schematic views showing production steps of the pellicle 300 in an embodiment.

The pellicle 300 in this embodiment may be produced by, for example, a method described below with reference to FIGS. 9A to 9D. The following production process is an example, and the order of production steps may be changed when necessary. FIGS. 9A to 9D show the production steps of the pellicle 300. A substrate 305 is prepared, and the pellicle film 301 is formed on the substrate 305 (FIG. 9A). The substrate 305 may be any of substantially the same members as those of the substrate 205, and thus will not be described in detail.

The pellicle film 301 is formed by vapor deposition on the substrate 305 so as to have a thickness of 20 nm or greater and 50 nm or less. The structure and the material of the pellicle film 301 are substantially the same as those of the pellicle film 201 described above, and thus will not be described in detail.

Figure 9B:
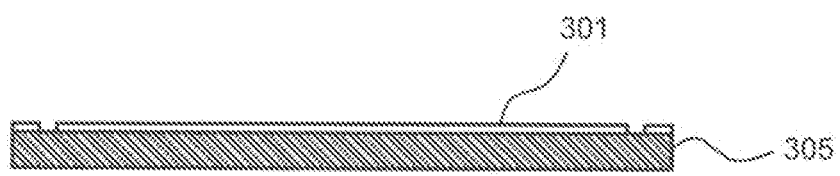
FIG. 9B provides schematic views showing production steps of the pellicle 300 in an embodiment.
Figure 9C:
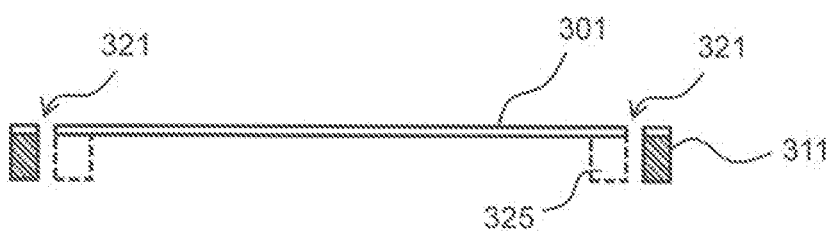
FIG. 9C provides schematic views showing production steps of the pellicle 300 in an embodiment.

The pellicle film 301 is etched to remove a part thereof at a predetermined position where the through-hole 321 is to be formed, and thus the substrate 305 is exposed (FIG. 9B). A surface of the substrate 305 that is opposite to a surface on which the pellicle film 301 is formed is etched to remove a part of the substrate 305 and to form the through-hole 321, and the groove 325 in communication with the through-hole 321, at the same time in the surface of the first frame 311 that faces the second frame 313 (FIG. 9C). In this embodiment, by this etching step, the through-hole 321 running through the pellicle film 301 is formed at the predetermined position where the pellicle film 301 has been removed, integrally with the groove 325.

Therefore, the through-hole 321 and the hole 323 each have such a diameter that, when the pressure is decreased from normal pressure (0.1 MPa) to a vacuum state at the time of exposure ($10^{-4}$ to $10^{-6}$ Pa), suppresses the expansion of the pellicle film 301, by a pressure difference between the inside and the outside of the pellicle 300, to less than 0.5 mm. In this embodiment, since the through-hole 321 is covered with a filter 331, the diameter of the through-hole 321 and the hole 323 is set in consideration of the resistance of the filter 331.

Figure 9D:
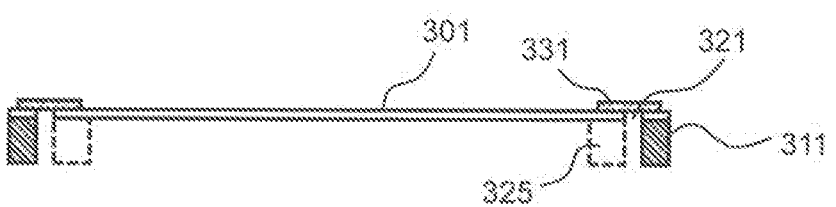
FIG. 9D provides schematic views showing production steps of the pellicle 300 in an embodiment.

The filter 331 covering the through-hole 321 is bonded onto the pellicle film 301 (FIG. 9D). The structure and the material of the filter 331 are substantially the same as those of the filter 231 described above, and thus will not be described in detail.

Separately from the above, the second frame 313 is prepared. The structure and the material of each of the second frame 313, an adhesive layer 341, an adhesive layer 343 and a liner 351 are substantially the same as those of the second frame 213, the adhesive layer 241, the adhesive layer 243 and the liner 251 described above, and thus will not be described in detail. The step of bonding the first frame 311 and the second frame 313 is substantially the same as that of the pellicle 200, and thus will not be described in detail.

Embodiment 4

Figure 10:
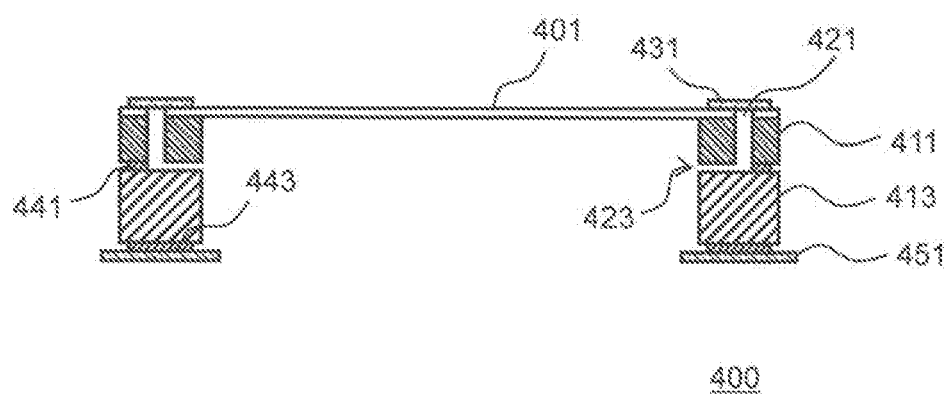
FIG. 10 is a cross-sectional view of a pellicle 400 in an embodiment, taken along line A-A' in FIG. 1.

Another modification of embodiment 2 will be described. FIG. 10 is a cross-sectional view of a pellicle 400 in an embodiment according to the present invention, taken along line A-A' in FIG. 1. Unlike in the pellicle 200 in embodiment 2, in the pellicle 400 in embodiment 4, an adhesive layer 441 provided between a first frame 411 and a second frame 413 is formed by partial painting to form a hole 423 in communication with a through-hole 421 and having an opening in an inner surface of the pellicle 400. Except for the above, the pellicle 400 has substantially the same structure as that of the pellicle 200, and thus will not be described in detail.

In the pellicle 400, the adhesive layer 441 is formed by partial painting between the first frame 411 and the second frame 413 to form the hole 423. Thus, the through-hole 421 running through a pellicle film 401 and the first frame 411, and the hole 423, are communicated with each other easily. Since the first frame 411 and the second frame 413 have an equal width, the pellicle film 401 may have a large opening.

(Method for Producing the Pellicle 400)

Figure 11A:
FIG. 11A provides schematic views showing production steps of the pellicle 400 in an embodiment.

The pellicle 400 in this embodiment may be produced by, for example, a method described below with reference to FIGS. 11A to 11D. The following production process is an example, and the order of production steps may be changed when necessary. FIGS. 11A to 11D show the production steps of the pellicle 400. A substrate 405 is prepared, and the pellicle film 401 is formed on the substrate 405 (FIG. 11A). The substrate 405 may be any of substantially the same members as those of the substrate 205, and thus will not be described in detail.

The pellicle film 401 is formed by vapor deposition on the substrate 405 so as to have a thickness of 20 nm or greater and 50 nm or less. The structure and the material of the pellicle film 401 are substantially the same as those of the pellicle film 201 described above, and thus will not be described in detail.

Figure 11B:
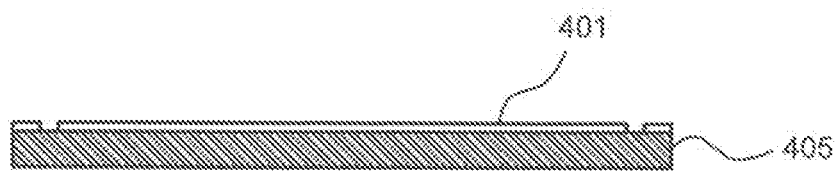
FIG. 11B provides schematic views showing production steps of the pellicle 400 in an embodiment.
Figure 11C:
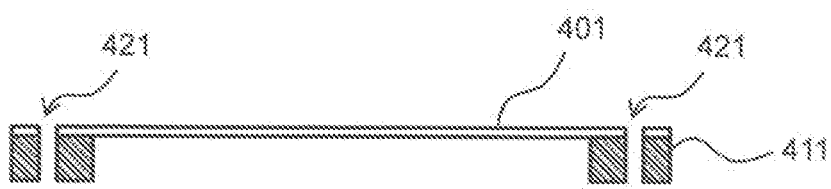
FIG. 11C provides schematic views showing production steps of the pellicle 400 in an embodiment.

The pellicle film 401 is etched to remove a part thereof at a predetermined position where the through-hole 421 is to be formed, and thus the substrate 405 is exposed (FIG. 11B). A surface of the substrate 405 that is opposite to a surface on which the pellicle film 401 is formed is etched to remove a part of the substrate 405 and to form a through-hole 421 in a surface of the first frame 411 that faces the second frame 413 (FIG. 11C).

Figure 11D:
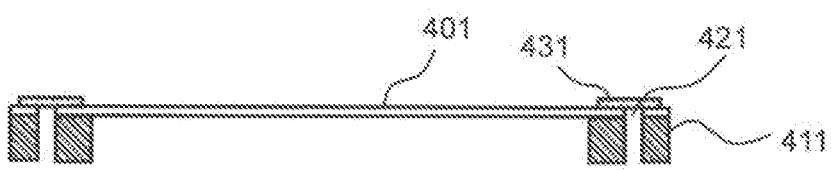
FIG. 11D provides schematic views showing production steps of the pellicle 400 in an embodiment.

A filter 431 covering the through-hole 421 is bonded onto the pellicle film 401 (FIG. 11D). The structure and the material of the filter 431 are substantially the same as those of the filter 231 described above, and thus will not be described in detail.

Figure 12A:
FIG. 12A provides schematic views showing production steps of the pellicle 400 in an embodiment.

Separately from the above, the second frame 413 is prepared (FIG. 12A). The structure and the material of each of the second frame 413, an adhesive layer 443 and a liner 451 are substantially the same as those of the second frame 213, the adhesive layer 243 and the liner 251 described above, and thus will not be described in detail.

Figure 12B:
FIG. 12B provides schematic views showing production steps of the pellicle 400 in an embodiment.
Figure 12C:
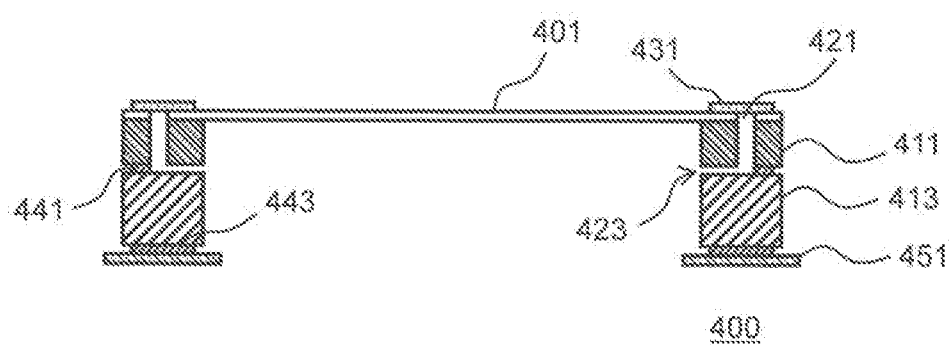
FIG. 12C provides schematic views showing production steps of the pellicle 400 in an embodiment.

The adhesive layer 441 is formed on a top surface of the second frame 413 (FIG. 12B). In this embodiment, the adhesive layer 441 is painted to a part of the top surface of the second frame 413 to form a groove 445 for forming the hole 423, which is to be in communication with the through-hole 421. The first frame 411 is secured to the second frame 413 with the formed adhesive layer 441 (FIG. 12C). In this step, the hole 423 in communication with the through-hole 421 is defined by the first frame 411, the second frame 413 and the groove 445. The adhesive layer 441 may be formed of any of substantially the same adhesive materials as those of the adhesive layer 241, and the materials will not be described in detail.

The through-hole 421 and the hole 423 each have such a diameter that, when the pressure is decreased from normal pressure (0.1 MPa) to a vacuum state at the time of exposure ($10^{-4}$ to $10^{-6}$ Pa), suppresses the expansion of the pellicle film 401, by a pressure difference between the inside and the outside of the pellicle 400, to less than 0.5 mm. In this embodiment, since the through-hole 421 is covered with the filter 431, the diameter of the through-hole 421 and the hole 423 is set in consideration of the resistance of the filter 431.

Embodiment 5

In embodiment 1 and embodiment 2, the filter is located on the top surface of the pellicle film, so that the filter covers the through-hole running through the pellicle film and the first frame. However, as described above, the space for attaching the pellicle to the photomask has a height of merely 2.5 mm. In this embodiment, an example in which the filter is located, adjacent to the pellicle film, on the first frame so as to decrease the height of the pellicle will be described.

Figure 13:
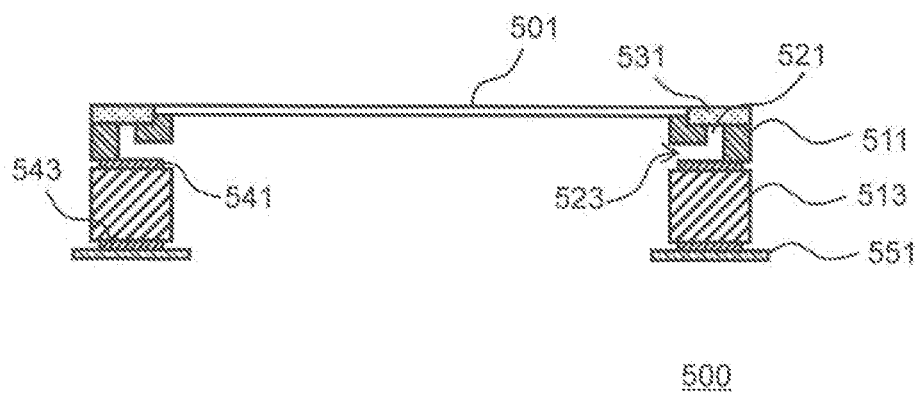
FIG. 13 is a cross-sectional view of a pellicle 500 in an embodiment, taken along line A-A' in FIG. 1.

FIG. 13 is a cross-sectional view of a pellicle 500 in an embodiment according to the present invention, taken along line A-A' in FIG. 1. The pellicle 500 includes a first frame 511 having a pellicle film 501 located thereon, and a second frame 513 supporting the first frame 511. The pellicle 500 also has a through-hole 521 running through the first frame 511, and includes a filter 531 covering the through-hole 521 on the side of a surface of the first frame 511 on which the pellicle film 501 is located. In this embodiment, the filter 531 is located, adjacent to the pellicle film 501, on the first frame 511.

In this embodiment, the first frame 511 has a groove 525, in communication with the through-hole 521, in a surface thereof facing the second frame 513. The groove 525, in combination with the second frame 513, forms a hole 523 in communication with the through-hole 521. The hole 523 has an opening in an inner surface of the first frame 511. In this embodiment, the filter 531 is located, adjacent to the pellicle film 501, on the first frame 511. It is preferable that the filter 531 is located such that a top surface of the filter 531 and a top surface of the pellicle film 501 are on the same plane. The filter 531 is located, with an adhesive layer (not shown), on a region in the first frame 511 from which a part of the pellicle film 501 and a part of the first frame 511 have been removed. The pellicle film 501 is located on the first frame 511 in this manner, and thus the height of the pellicle 500 is made lower by the thickness of the filter 531.

The pellicle film 501, the first frame 511 and the second frame 513 may be formed of any of substantially the same materials as those of the pellicle film 101, the substrate 105 and the second frame 113 described above, and the materials will not be described in detail.

The first frame 511 and the second frame 513 are secured to each other with an adhesive layer 541. Preferably, the adhesive layer 541 has a minimum possible thickness that guarantees a sufficient adhesiveness between the first frame 511 and the second frame 513. For example, the adhesive layer 541 has a thickness of 10 μm or greater and 300 μm or less. The adhesive layer 541 may be formed of any of substantially the same adhesive materials as those of the adhesive layer 141, and the materials will not be described in detail.

The through-hole 521 is provided in the region from which the part of the pellicle film 501 and the part of the first frame 511 have been removed, so as to run through the first frame 511. In this embodiment, the groove 525 in communication with the through-hole 521 is located in the surface of the first frame 511 that faces the second frame 513, so that a combination of the groove 525 and the second frame 513 forms the hole 523 in communication with the through-hole 521. Therefore, the through-hole 521, and the hole 523 communicating the through-hole 521 and the opening formed in the inner surface of the first frame 511, each have such a diameter that, when the pressure is decreased from normal pressure (0.1 MPa) to a vacuum state at the time of exposure ($10^{-4}$ to $10^{-6}$ Pa), suppresses the expansion of the pellicle film 501, by a pressure difference between the inside and the outside of the pellicle 500, to less than 0.5 mm. In this embodiment, the diameter of the through-hole 521 and the hole 523 is set in consideration of the upper limit of the pressure loss caused at the through-hole 521 when the pressure is decreased.

The pressure loss caused at the through-hole 521 when the pressure is decreased is desirably 1 Pa or less, more desirably 0.5 Pa or less. It is preferable that the filter 531 is located to cover the through-hole 521, so that when the pressure is decreased, a majority of the pressure loss is caused at the filter 531 whereas almost no pressure loss is caused at the through-hole 521. For example, the size the through-hole 521 is adjusted such that the pressure loss at the through-hole 521 is 1 Pa or less, preferably about 0.1 Pa.

In the case where, for example, the pressure is decreased at a rate of 350 Pa/sec., when the pressure loss caused at the through-hole 521, i.e., the pressure difference between the inside and the outside of the pellicle 500, is 1 Pa, the number of the through-holes 521 is 4 and the diameter of each through-hole 521 is 480 μm. The through-holes 521 may have any shape with no specific limitation, and may be circular, elliptical, rectangular, polygonal, trapezoidal or the like. There is no specific limitation on the diameter of the through-holes 521, but it is desirable that the through-holes 521 each have a diameter of about 10 to about 500 μm as long as the strength of the first frame is not decreased. There is no specific limitation on the number of the through-holes 521, and the number of the through-holes 521 may be selected in accordance with the length or the width of the filter.

The filter 531 may be formed of any of substantially the same materials as those of the filter 131, and the materials will not be described in detail. Preferably, the filter 531 has a width of 1 mm or greater and 4 mm or less in order to guarantee the adhesiveness with the first frame 511 and a certain level of aperture ratio of the pellicle 500. It is sufficient that the width of the filter 531 is within the width of the first frame 511.

The total area size of the filter 531 is set in consideration of the upper limit of the pressure loss caused at the filter 531 when the pressure is decreased. The pressure loss caused at the filter 531 when the pressure is decreased is desirably 2

Pa or less. The length of the filter 531 is calculated by dividing the area size of the filter 531 by the width of the filter 531. There is no specific limitation on the length of each filter. The length of the filter is desirably 1 cm or greater and 15 cm or less, more desirably 2 cm or greater and 10 cm or less. The thickness (height) of the filter needs to be determined such that the total of the height of the pellicle and the thickness (height) of the filter is less than 2.5 mm because the space for attaching the pellicle to the photomask has a height of merely 2.5 mm. Depending on the height of the pellicle, the thickness of the filter is preferably 0.05 mm or greater and 1.0 mm or less, and is more preferably 0.1 mm or greater and 0.4 mm or less.

An adhesive layer 543 is located on a bottom surface of the second frame 513. The adhesive layer 543 is an element used to secure the pellicle 500 to the photomask. The adhesive layer 543 preferably has a minimum possible thickness that guarantees a sufficient adhesiveness between the photomask and the second frame 513. The thickness of the adhesive layer 543 is, for example, 10 μm or greater and 300 μm or less. The adhesive layer 543 may be formed of any of substantially the same adhesive materials as those of the adhesive layer 143, and the materials will not be described in detail.

In the pellicle 500, the filter is located such that the top surface of the filter 531 and the top surface of the pellicle film 501 are on the same plane. Therefore, it is preferable that the total height of the pellicle film 501, the first frame 511, the adhesive layer 541, the second frame 513 and the adhesive layer 543 is 2 mm or less. As described above, the space for attaching the pellicle to the photomask has a height of merely 2.5 mm. Therefore, in order to prevent breakage of the pellicle film 501, the height of the pellicle 500 is preferably 2 mm or less.

In order to prevent dust or the like from being attached to the adhesive layer 543 of the pellicle 500 before use, the adhesive layer 543 is protected by a peelable liner 551.

According to the present invention, in the region from which the part of the pellicle film 501 and the part of the first frame 511 have been removed, the through-hole 521 runs through the first frame 511, and a combination of the groove 525 in the first frame 511 and the second frame 513 forms the hole 523 in communication with the through-hole 521. Thus, the filter 531 is located with a sufficient close-adhesiveness with no gap, other than the through-hole 521, being formed in a rear surface of the filter 531. According to the present invention, the filter 531 is located, adjacent to the pellicle film 501, on the first frame 511, so that the height of the pellicle 500 is decreased. Since the filter 531 is located such that the top surface of the filter 531 and the top surface of the pellicle film 501 are on the same plane, the height of the pellicle 500 is suppressed lower by the thickness of the filter 531.

(Method for Producing the Pellicle 500)

Figure 14A:
FIG. 14A provides schematic views showing production steps of the pellicle 500 in an embodiment.

The pellicle 500 in this embodiment may be produced by, for example, a method described below with reference to FIGS. 14A to 14D. The following production process is an example, and the order of production steps may be changed when necessary. FIGS. 14A to 14D show the production steps of the pellicle 500. A substrate 505 is prepared, and the pellicle film 501 is formed on the substrate 505 (FIG. 14A). As described above, the substrate 505 may be, for example, a silicon substrate, a sapphire substrate, a silicon carbide substrate or the like. The substrate 505 is not limited to any of these, but is preferably a silicon substrate, a sapphire substrate, or a silicon carbide substrate, and is more preferably a silicon substrate.

The pellicle film 501 is formed by vapor deposition on the substrate 505 so as to have a thickness of 20 nm or greater and 50 nm or less. EUV light is easily absorbed to any substance. Therefore, it is preferable that the pellicle film 501 is formed to be thin so as to have a transmittance of 90.0% or greater with respect to light having a wavelength of 5 nm or longer and 30 nm or shorter. The pellicle film 501 according to the present invention has a transmittance of 90.0% or greater with respect to light having a wavelength of, preferably, about 5 nm to about 13.5 nm, more preferably 13.5±0.3 nm.

Figure 14B:
FIG. 14B provides schematic views showing production steps of the pellicle 500 in an embodiment.
Figure 14C:
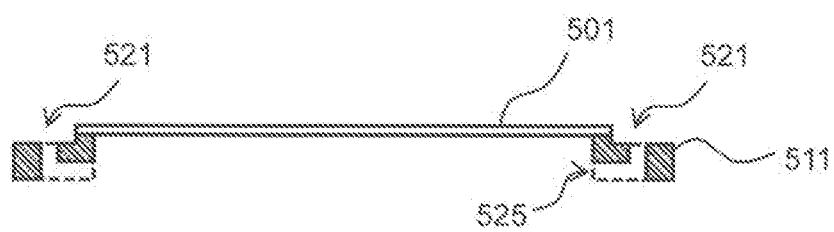
FIG. 14C provides schematic views showing production steps of the pellicle 500 in an embodiment.

The pellicle film 501 and the substrate 505 are etched to remove a part thereof at a predetermined position where the through-hole 521 is to be formed, and thus the substrate 505 is exposed (FIG. 14B). A surface of the substrate 505 that is opposite to a surface on which the pellicle film 501 is formed is etched to remove a part of the substrate 505 thus to expose the pellicle film 501, and to form the groove 525, which is to be in communication with the through-hole 521, in the surface of the first frame 511 that faces the second frame 511. The through-hole 521 running through the pellicle film 501 and the first frame 511 is formed at the predetermined position where the part of the pellicle film 101 and the part of the first frame 511 have been removed (FIG. 14C).

In this embodiment, the groove 525 in communication with the through-hole 521 is located in the surface of the first frame 511 that faces the second frame 513, so that a combination of the groove 525 and the second frame 513 forms the hole 523 in communication with the through-hole 521. Therefore, the through-hole 521 and the hole 523 each have such a diameter that, when the pressure is decreased from normal pressure (0.1 MPa) to a vacuum state at the time of exposure ($10^{-4}$ to $10^{-6}$ Pa), suppresses the expansion of the pellicle film 501, by a pressure difference between the inside and the outside of the pellicle 500, to less than 0.5 mm. In this embodiment, since the through-hole 521 is covered with the filter 531, the diameter of the through-hole 521 and the hole 523 is set in consideration of the resistance of the filter 531.

Figure 14D:
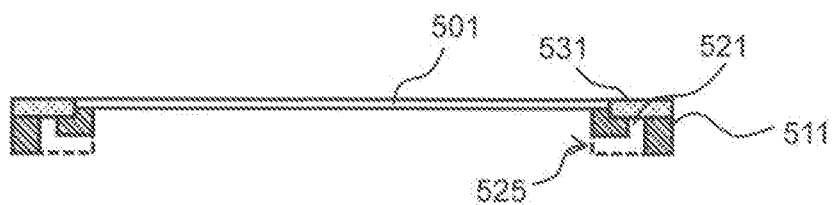
FIG. 14D provides schematic views showing production steps of the pellicle 500 in an embodiment.

The filter 531 covering the through-hole 521 is bonded to the region form which the part of the pellicle film 501 and the part of the substrate 505 have been removed (FIG. 14D). The filter 531 preferably has the above-described properties, and preferably has a width of 1 mm or greater and 4 mm or less in order to guarantee the adhesiveness with the first frame 511 and a certain level of aperture ratio of the pellicle 500. There is no specific limitation on the timing when the filter 531 is bonded. The filter 531 may be bonded after the first frame 511 is secured to the second frame.

The total area size of the filter 531 is set in consideration of the upper limit of the pressure loss caused at the filter 531 when the pressure is decreased. The pressure loss caused at the filter 531 when the pressure is decreased is desirably 2 Pa or less. The length of the filter 531 is calculated by dividing the area size of the filter 531 by the width of the filter 531. There is no specific limitation on the length of each filter. The length of the filter is desirably 1 cm or greater and 15 cm or less, more desirably 2 cm or greater and 10 cm or less. The thickness (height) of the filter needs to be determined such that the total of the height of the pellicle and the thickness (height) of the filter is less than 2.5 mm because the space for attaching the pellicle to the photomask has a height of merely 2.5 mm. Depending on the height of the pellicle, the thickness of the filter is preferably 0.05 mm or greater and 1.0 mm or less, and is more preferably 0.1 mm or greater and 0.4 mm or less.

Separately from the above, the second frame 513 is prepared like in embodiment 1. The adhesive layer 543 is formed on the bottom surface of the second frame 513. The liner 551 protecting the adhesive layer 543 is located. In this step, the liner 551 having the adhesive layer 543 formed thereon may be prepared and bonded to the bottom surface of the second frame 513 such that the liner 551 is bonded to the bottom surface with the adhesive layer 543.

The adhesive layer 541 is formed on a top surface of the second frame 513. The first frame 511 is secured to the second frame 513 with the formed adhesive layer 541. In this step, a combination of the groove 525 formed in the surface facing the second frame 513, and the second frame 513, forms the hole 523 in communication with the through-hole 521.

Since the space for attaching the pellicle to the photomask has a height of merely 2.5 mm, the filter 531 is located such that the top surface of the filter 531 and the top surface of the pellicle film 501 are on the same plane in this embodiment. It is preferable that the total height of the pellicle film 501, the first frame 511, the adhesive layer 541, the second frame 513 and the adhesive layer 543 is 2 mm or less.

According to the present invention, in the region from which the part of the pellicle film 501 and the part of the first frame 511 have been removed, the through-hole 521 runs through the first frame 511. A combination of the groove 525 and the second frame 513 forms the hole 523 in communication with the through-hole 521. Thus, the filter 531 is located with a sufficient close-adhesiveness with no gap, other than the through-hole 521, being formed in the rear surface of the filter 531. According to the present invention, the filter 531 is located, adjacent to the pellicle film 501, on the first frame 511, so that the height of the pellicle 500 is decreased. Since the filter 531 is located such that the top surface of the filter 531 and the top surface of the pellicle film 501 are on the same plane, the height of the pellicle 500 is suppressed lower by the thickness of the filter 531.

Embodiment 6

Figure 15:
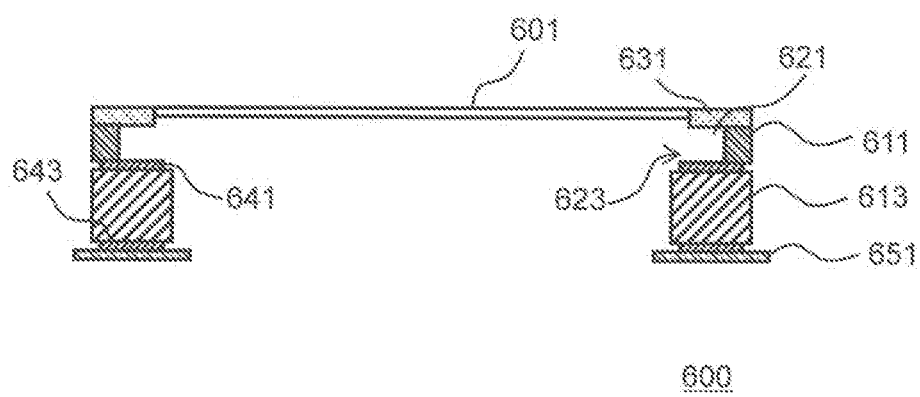
FIG. 15 is a cross-sectional view of a pellicle 600 in an embodiment, taken along line A-A' in FIG. 1.

In a modification of embodiment 5, a pellicle 600 in embodiment 6 will be described. FIG. 15 is a cross-sectional view of the pellicle 600 in an embodiment according to the present invention, taken along line A-A' in FIG. 1. Unlike in the pellicle 500 in embodiment 5, in the pellicle 600 in embodiment 6, a groove 625 in a first frame 611 is extended by etching to a position in contact with a pellicle film 601 to form a hole 623 having a height approximately equal to the height of a through-hole 621. Except for the above, the pellicle 600 has substantially the same structure as that of the pellicle 500, and thus will not be described in detail.

In the pellicle 600, in a region from which a part of the pellicle film 601 and a part of the first frame 611 have been removed, the through-hole 621 runs through the first frame 611. A combination of the groove 625 in the first frame 611 and a second frame 613 forms the hole 623 in communication with the through-hole 621. Thus, a filter 631 is located with a sufficient close-adhesiveness with no gap, other than the through-hole 621, being formed in a rear surface of the filter 631. According to the present invention, the filter 631 is located, adjacent to the pellicle film 601, on the first frame 611, so that the height of the pellicle 600 is decreased. Since the filter 631 is located such that a top surface of the filter 631 and a top surface of the pellicle film 601 are on the same plane, the height of the pellicle 600 is suppressed lower by the thickness of the filter 631. In addition, in the pellicle 600, the through-hole 621 runs through the pellicle film 601 and the first frame 611, and the groove 625 in the first frame 611 is in direct communication with the second frame 613 to form the hole 623 in direct communication with the through-hole 621. Thus, the ventilation is significantly improved.

(Method for Producing the Pellicle 600)

Figure 16A:
FIG. 16A provides schematic views showing production steps of the pellicle 600 in an embodiment.

The pellicle 600 in this embodiment may be produced by, for example, a method described below with reference to FIGS. 16A to 16D. The following production process is an example, and the order of production steps may be changed when necessary. FIGS. 16A to 16D shows the production steps of the pellicle 600. A substrate 605 is prepared, and the pellicle film 601 is formed on the substrate 605 (FIG. 16A). The substrate 605 may be any of substantially the same members as those of the substrate 505, and thus will not be described in detail.

The pellicle film 601 is formed by vapor deposition on the substrate 605 so as to have a thickness of 20 nm or greater and 50 nm or less. The structure and the material of the pellicle film 601 are substantially the same as those of the pellicle film 501 described above, and thus will not be described in detail.

Figure 16B:
FIG. 16B provides schematic views showing production steps of the pellicle 600 in an embodiment.
Figure 16C:
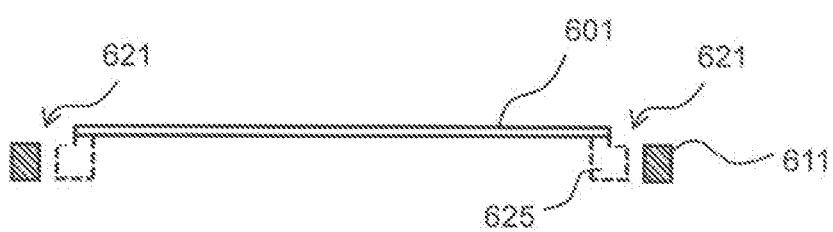
FIG. 16C provides schematic views showing production steps of the pellicle 600 in an embodiment.

The pellicle film 601 and the substrate 605 are etched to remove a part thereof at a predetermined position where the through-hole 621 is to be formed, and thus the substrate 605 is exposed (FIG. 16B). A surface of the substrate 605 that is opposite to a surface on which the pellicle film 601 is formed is etched to remove a part of the substrate 605 and to form the through-hole 621, and the groove 625 in communication with the through-hole 621, at the same time in a surface of the first frame 611 that faces the second frame 613 (FIG. 16C). In this embodiment, by this etching step, the through-hole 621 running through the pellicle film 601 is formed at the predetermined position where the pellicle film 601 has been removed, integrally with the groove 625.

Therefore, the through-hole 621 and the hole 623 each have such a diameter that, when the pressure is decreased from normal pressure (0.1 MPa) to a vacuum state at the time of exposure ($10^{-4}$ to $10^{-6}$ Pa), suppresses the expansion of the pellicle film 601, by a pressure difference between the inside and the outside of the pellicle 600, to less than 0.5 mm. In this embodiment, since the through-hole 621 is covered with a filter 631, the diameter of the through-hole 621 and the hole 623 is set in consideration of the resistance of the filter 631.

Figure 16D:
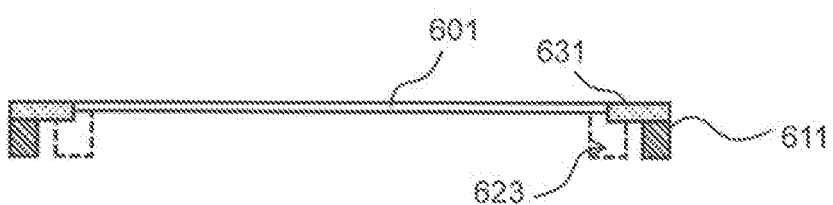
FIG. 16D provides schematic views showing production steps of the pellicle 600 in an embodiment.

The filter 631 covering the through-hole 621 is bonded in the region from which the part of the pellicle film 601 and the part of the substrate 605 have been removed (FIG. 16D). The structure and the material of the filter 631 are substantially the same as those of the filter 531 described above, and thus will not be described in detail.

Separately from the above, the second frame 613 is prepared. The structure and the material of each of the second frame 613, an adhesive layer 641, an adhesive layer 643 and a liner 651 are substantially the same as those of the second frame 513, the adhesive layer 541, the adhesive layer 543 and the liner 551 described above, and thus will not be described in detail. The step of bonding the first frame 611 and the second frame 613 is substantially the same as that of the pellicle 500, and thus will not be described in detail.

Embodiment 7

In the pellicle in each of embodiments 2 through 6, the groove in communication with the through-hole is formed in the first frame to form the hole. In this embodiment, an example in which a hole in communication with the through-hole is formed in the second frame will be described.

Figure 17:
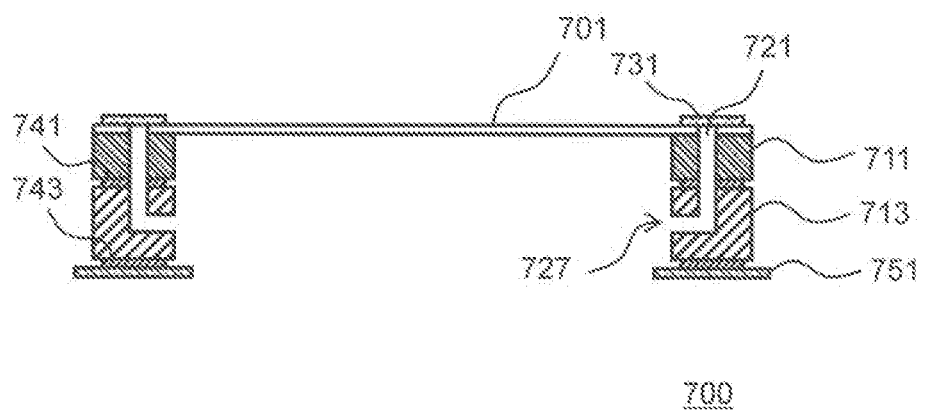
FIG. 17 is a cross-sectional view of a pellicle 700 in an embodiment, taken along line A-A' in FIG. 1.

FIG. 17 is a cross-sectional view of a pellicle 700 in an embodiment according to the present invention, taken along line A-A' in FIG. 1. The pellicle 700 includes a first frame 711 having a pellicle film 701 located thereon, and a second frame 713 supporting the first frame 711. The pellicle 700 also has a through-hole 721 running through the pellicle film 701 and the first frame 711, and includes a filter 731 located on the pellicle film 701 and covering the through-hole 721.

In this embodiment, the second frame 713 has a first opening 723 located in a surface thereof facing the first frame 711 and a second opening 725 located in an inner surface thereof. The two openings are in communication with each other via a hole 727 located in the second frame 713, and the first opening 723 is in communication with the through-hole 721. The filter 731 is located, with an adhesive layer (not shown), on a region in the first frame 711 where the pellicle film 701 is located.

The pellicle film 701, the first frame 711 and the second frame 713 may each be formed of any of substantially the same materials as those of the pellicle film 101, the substrate 105 and the second frame 113 described above, and the materials will not be described in detail.

The first frame 711 and the second frame 713 are secured to each other with an adhesive layer 741. Preferably, the adhesive layer 741 has a minimum possible thickness that guarantees a sufficient adhesiveness between the first frame 711 and the second frame 713. For example, the adhesive layer 741 has a thickness of 10 µm or greater and 300 µm or less. The adhesive layer 741 may be formed of any of substantially the same adhesive materials as those of the adhesive layer 141, and the materials will not be described in detail.

The through-hole 721 is provided so as to run through the pellicle film 701 and the first frame 711. In this embodiment, the second frame 713 has the first opening 723 located in the surface thereof facing the first frame 711 and the second opening 725 located in the inner surface thereof. The two openings are in communication with each other via the hole 727 located in the second frame 713, and the first opening 723 is in communication with the through-hole 721. Therefore, the through-hole 721 and the hole 727 located in the second frame 713 each have such a diameter that, when the pressure is decreased from normal pressure (0.1 MPa) to a vacuum state at the time of exposure ($10^{-4}$ to $10^{-6}$ Pa), suppresses the expansion of the pellicle film 701, by a pressure difference between the inside and the outside of the pellicle 700, to less than 0.5 mm. In this embodiment, the diameter of the through-hole 721 and the hole 727 is set in consideration of the upper limit of the pressure loss caused at the through-hole 721 when the pressure is decreased.

The pressure loss caused at the through-hole 721 when the pressure is decreased is desirably 1 Pa or less, more desirably 0.5 Pa or less. It is preferable that the filter 731 is located to cover the through-hole 721, so that when the pressure is decreased, a majority of the pressure loss is caused at the filter 731 whereas almost no pressure loss is caused at the through-hole 721. For example, the size of the through-holes 721 is adjusted such that the pressure loss at the through-holes 721 is 1 Pa or less, preferably about 0.1 Pa.

In the case where, for example, the pressure is decreased at a rate of 350 Pa/sec., when the pressure loss caused at the through-hole 721, i.e., the pressure difference between the inside and the outside of the pellicle 700, is 1 Pa, the number of the through-holes 721 is 4 and the diameter of each through-hole 721 is 500 µm. The through-holes 721 may have any shape with no specific limitation, and may be circular, elliptical, rectangular, polygonal, trapezoidal or the like. There is no specific limitation on the diameter of the through-holes 721, but it is desirable that the through-holes 721 each have a diameter of about 10 to about 500 µm as long as the strength of the first frame is not decreased. There is no specific limitation on the number of the through-holes 721, and the number of the through-holes 721 may be selected in accordance with the length or the width of the filter.

The filter 731 may be formed of any of substantially the same materials as those of the filter 131, and the materials will not be described in detail. Preferably, the filter 731 has a width of 1 mm or greater and 4 mm or less in order to guarantee the adhesiveness with the pellicle film 701 and a certain level of aperture ratio of the pellicle 700. It is sufficient that the width of the filter 731 is within the width of the first frame 711.

The total area size of the filter 731 is set in consideration of the upper limit of the pressure loss caused at the filter 731 when the pressure is decreased. The pressure loss caused at the filter 731 when the pressure is decreased is desirably 2 Pa or less. The length of the filter 731 is calculated by dividing the area size of the filter 731 by the width of the filter 731. There is no specific limitation on the length of each filter. The length of the filter is desirably 1 cm or greater and 15 cm or less, more desirably 2 cm or greater and 10 cm or less.

An adhesive layer 743 is located on a bottom surface of the second frame 713. The adhesive layer 743 is an element used to secure the pellicle 700 to the photomask. The adhesive layer 743 preferably has a minimum possible thickness that guarantees a sufficient adhesiveness between the photomask and the second frame 713. The thickness of the adhesive layer 743 is, for example, 10 µm or greater and 300 µm or less. The adhesive layer 743 may be formed of any of substantially the same adhesive materials as those of the adhesive layer 143, and the materials will not be described in detail.

Regarding the pellicle 700, it is preferable that the total height of the pellicle film 701, the first frame 711, the adhesive layer 741, the second frame 713 and the adhesive layer 743 is 2 mm or less. As described above, the space for attaching the pellicle to the photomask has a height of merely 2.5 mm. Therefore, in order to prevent breakage of the pellicle film 701, the height of the pellicle 700 is preferably 2 mm or less.

In order to prevent dust or the like from being attached to the adhesive layer 743 of the pellicle 700 before use, the adhesive layer 743 is protected by a peelable liner 751.

In this embodiment, the through-hole 721 runs through the pellicle film 701 and the first frame 711 and is in communication with the hole 727 located in the second frame 713. Thus, the filter 731 is located with a sufficient close-adhesiveness with no gap, other than the through-hole 721, being formed in a rear surface of the filter 731. In this embodiment, the hole 727 is formed in the second frame 713. Thus, the processing is performed more easily than in the case where the hole is formed in the first frame.

(Method for Producing the Pellicle 700)

Figure 18A:
FIG. 18A provides schematic views showing production steps of the pellicle 700 in an embodiment.

The pellicle 700 in this embodiment may be produced by, for example, a method described below with reference to FIGS. 18A to 18D and FIGS. 19A to 19D. The following production process is an example, and the order of production steps may be changed when necessary. FIGS. 18A to 18D and FIGS. 19A to 19D show the production steps of the pellicle 700. A substrate 705 is prepared, and the pellicle film 701 is formed on the substrate 705 (FIG. 18A). As described above, the substrate 705 may be, for example, a silicon substrate, a sapphire substrate, a silicon carbide substrate or the like, but is not limited to any of these.

The pellicle film 701 is formed by vapor deposition on the substrate 705 so as to have a thickness of 20 nm or greater and 50 nm or less. EUV light is easily absorbed to any substance. Therefore, it is preferable that the pellicle film 701 is formed to be thin so as to have a transmittance of 90.0% or greater with respect to light having a wavelength of 5 nm or longer and 30 nm or shorter. The pellicle film 701 according to the present invention has a transmittance of 90.0% or greater with respect to light having a wavelength of, preferably, about 5 nm to about 13.5 nm, more preferably 13.5±0.3 nm.

Figure 18B:
FIG. 18B provides schematic views showing production steps of the pellicle 700 in an embodiment.
Figure 18C:
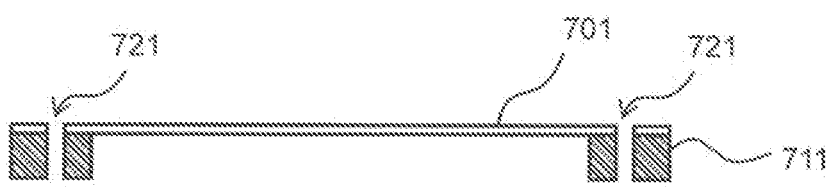
FIG. 18C provides schematic views showing production steps of the pellicle 700 in an embodiment.

The pellicle film 701 is etched to remove a part thereof at a predetermined position where the through-hole 721 is to be formed, and thus the substrate 705 is exposed (FIG. 18B). A surface of the substrate 705 that is opposite to a surface on which the pellicle film 701 is formed is etched to remove a part of the substrate 705 and to form the through-hole 721, running through the pellicle film 701 and the first frame 711, at the predetermined position where the pellicle film 701 has been removed (FIG. 18C).

In this embodiment, the first opening 723 is formed in the surface of the second frame 713 that faces the first frame 711, the second opening 725 is formed in the inner surface of the second frame 713, the hole 727 communicating the two openings to each other is formed in the second frame 713, and the first opening 723 is communicated with the through-hole 721. Therefore, the through-hole 721 and the hole 727 each have such a diameter that, when the pressure is decreased from normal pressure (0.1 MPa) to a vacuum state at the time of exposure ($10^{-4}$ to $10^{-6}$ Pa), suppresses the expansion of the pellicle film 701, by a pressure difference between the inside and the outside of the pellicle 700, to less than 0.5 mm. In this embodiment, since the through-hole 721 is covered with the filter 731, the diameter of the through-hole 721 and the hole 727 is set in consideration of the resistance of the filter 731.

Figure 18D:
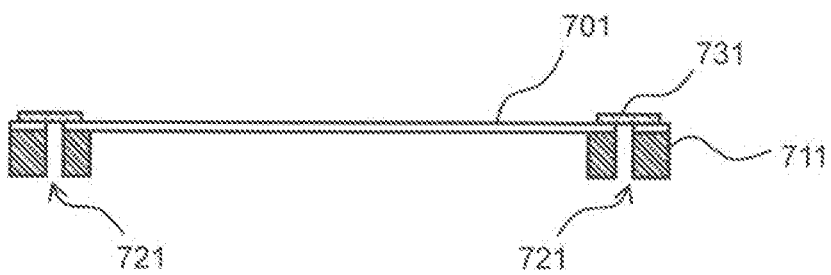
FIG. 18D provides schematic views showing production steps of the pellicle 700 in an embodiment.

The filter 731 covering the through-hole 721 is bonded onto the pellicle film 701 (FIG. 18D). The filter 731 preferably has the above-described properties, and preferably has a width of 1 mm or greater and 4 mm or less in order to guarantee the adhesiveness with the pellicle film 701 and a certain level of aperture ratio of the pellicle 700. There is no specific limitation on the timing when the filter 731 is bonded. The filter 731 may be bonded after the first frame 711 is secured to the second frame.

Figure 19A:
FIG. 19A provides schematic views showing production steps of the pellicle 700 in an embodiment.

Separately from the above, the second frame 713 is prepared. In this embodiment, the first opening 723 is formed in the surface of the second frame 713 that faces the first frame 711, the second opening 725 is formed in the inner surface of the second frame 713, and the hole 727 communicating the two openings to each other is formed in the second frame 713 (FIG. 19A).

Figure 19B:
FIG. 19B provides schematic views showing production steps of the pellicle 700 in an embodiment.

The adhesive layer 743 is formed on the bottom surface of the second frame 713. The liner 751 protecting the adhesive layer 743 is located (FIG. 19B). In this step, the liner 751 having the adhesive layer 743 formed thereon may be prepared and bonded to the bottom surface of the second frame 713 such that the liner 751 is bonded to the bottom surface with the adhesive layer 743.

Figure 19C:
FIG. 19C provides schematic views showing production steps of the pellicle 700 in an embodiment.
Figure 19D:
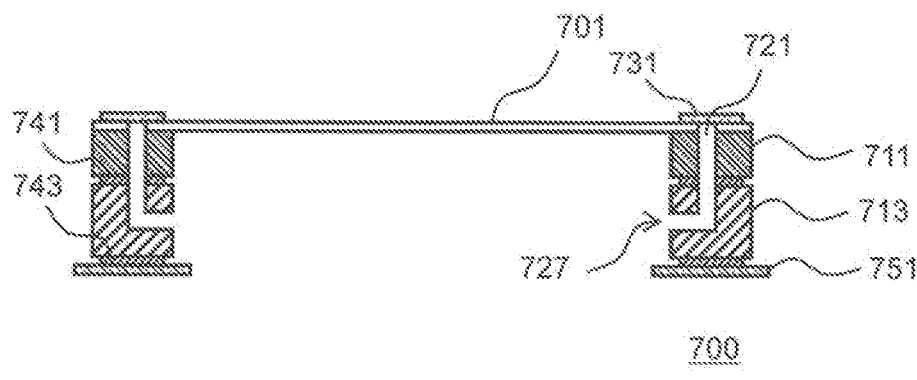
FIG. 19D provides schematic views showing production steps of the pellicle 700 in an embodiment.

The adhesive layer 741 is formed on a top surface of the second frame 713 (FIG. 19C). The first frame 711 is secured to the second frame 713 with the formed adhesive layer 741 (FIG. 19D). In this step, the first opening 723 is communicated with the through-hole 721, and the through-hole 721 and the hole 727 form a vent hole.

Since the space for attaching the pellicle to the photomask has a height of merely 2.5 mm, it is preferable in this embodiment that the total height of the filter 731, the pellicle film 701, the first frame 711, the adhesive layer 741, the second frame 713 and the adhesive layer 743 is 2 mm or less.

In this embodiment, the through-hole 721 runs through the pellicle film 701 and the first frame 711 and is communicated with the hole 727 formed in the second frame 713. Thus, the filter 731 is located with a sufficient close-adhesiveness with no gap, other than the through-hole 721, being formed in the rear surface of the filter 731. In this embodiment, the hole 727 is formed in the second frame 713. Thus, the processing is performed more easily than in the case where the hole is formed in the first frame.

Embodiment 8

Figure 20:
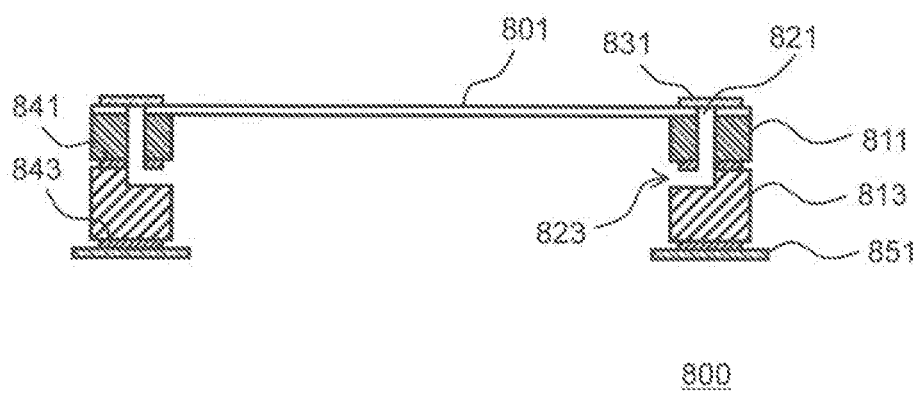
FIG. 20 is a cross-sectional view of a pellicle 800 in an embodiment, taken along line A-A' in FIG. 1.

In a modification of embodiment 7, a pellicle 800 will be described. FIG. 20 is a cross-sectional view of the pellicle 800 in an embodiment according to the present invention, taken along line A-A' in FIG. 1. The pellicle 800 includes a first frame 811 having a pellicle film 801 located thereon, and a second frame 813 supporting the first frame 811. The pellicle 800 also has a through-hole 821 running through the pellicle film 801 and the first frame 811, and includes a filter 831 located on the pellicle film 801 and covering the through-hole 821.

In this embodiment, the second frame 813 has a groove 825, in communication with the through-hole 821, in a surface thereof facing the first frame 811. The groove 825, in combination with the first frame 811, forms a hole 823 in communication with the through-hole 821. The hole 823 has an opening in an inner surface of the second frame 813. The filter 831 is located, with an adhesive layer (not shown), on a region in the first frame 811 where the pellicle film 801 is provided.

The pellicle film 801, the first frame 811 and the second frame 813 may each be formed of any of substantially the same materials as those of the pellicle film 101, the substrate 105 and the second frame 113 described above, and the materials will not be described in detail.

The first frame 811 and the second frame 813 are secured to each other with an adhesive layer 841. Preferably, the adhesive layer 841 has a minimum possible thickness that guarantees a sufficient adhesiveness between the first frame 811 and the second frame 813. For example, the adhesive layer 841 has a thickness of 10 µm or greater and 300 µm or less. The adhesive layer 841 may be formed of any of substantially the same adhesive materials as those of the adhesive layer 141, and the materials will not be described in detail.

The through-hole 821 is provided so as to run through the pellicle film 801 and the first frame 811. In this embodiment, the second frame 813 has the groove 825, in communication with the through-hole 821, in the surface thereof facing the first frame 811, and the groove 825, in combination with the first frame 811, forms the hole 823 in communication with the through-hole 821. The hole 823 has the opening in the inner surface of the second frame 813. Therefore, the through-hole 821, and the hole 823 formed by a combination of the groove 825 and the first frame 811, each have such a diameter that, when the pressure is decreased from normal pressure (0.1 MPa) to a vacuum state at the time of exposure ($10^{-4}$ to $10^{-6}$ Pa), suppresses the expansion of the pellicle film 801, by a pressure difference between the inside and the outside of the pellicle 800, to less than 0.5 mm. In this embodiment, the diameter of the through-hole 821 and the hole 823 is set in consideration of the upper limit of the pressure loss caused at the through-hole when the pressure is decreased.

The pressure loss caused at the through-hole 821 when the pressure is decreased is desirably 1 Pa or less, more desirably 0.5 Pa or less. It is preferable that the filter 831 is located to cover the through-hole 821, so that when the pressure is decreased, a majority of the pressure loss is caused at the filter 831 whereas almost no pressure loss is caused at the through-hole 821. For example, the size of the through-holes 821 is adjusted such that the pressure loss at the through-holes 821 is 1 Pa or less, preferably about 0.1 Pa.

In the case where, for example, the pressure is decreased at a rate of 350 Pa/sec., when the pressure loss caused at the through-hole 821, i.e., the pressure difference between the inside and the outside of the pellicle 800, is 1 Pa, the number of the through-holes 821 is 4 and the diameter of each through-hole 821 is 480 µm. The through-holes 821 may have any shape with no specific limitation, and may be circular, elliptical, rectangular, polygonal, trapezoidal or the like. There is no specific limitation on the diameter of the through-holes 821, but it is desirable that the through-holes 821 each have a diameter of about 10 to about 500 µm as long as the strength of the first frame is not decreased. There is no specific limitation on the number of the through-holes 821, and the number of the through-holes 821 may be selected in accordance with the length or the width of the filter.

The filter 831 may be formed of any of substantially the same materials as those of the filter 131, and the materials will not be described in detail. Preferably, the filter 831 has a width of 1 mm or greater and 4 mm or less in order to guarantee the adhesiveness with the pellicle film 801 and a certain level of aperture ratio of the pellicle 800. It is sufficient that the width of the filter 831 is within the width of the first frame 811.

The total area size of the filter 831 is set in consideration of the upper limit of the pressure loss caused at the filter 831 when the pressure is decreased. The pressure loss caused at the filter 831 when the pressure is decreased is desirably 2 Pa or less. The length of the filter 831 is calculated by dividing the area size of the filter 831 by the width of the filter 831. There is no specific limitation on the length of each filter. The length of the filter is desirably 1 cm to 15 cm, more desirably 2 cm to 10 cm.

An adhesive layer 843 is located on a bottom surface of the second frame 813. The adhesive layer 843 is an element used to secure the pellicle 800 to the photomask. The adhesive layer 843 preferably has a minimum possible thickness that guarantees a sufficient adhesiveness between the photomask and the second frame 813. The thickness of the adhesive layer 843 is, for example, 10 µm or greater and 300 µm or less. The adhesive layer 843 may be formed of any of substantially the same adhesive materials as those of the adhesive layer 143, and the materials will not be described in detail.

Regarding the pellicle 800, it is preferable that the total height of the filter 831, the pellicle film 801, the first frame 811, the adhesive layer 841, the second frame 813 and the adhesive layer 843 is 2 mm or less. As described above, the space for attaching the pellicle to the photomask has a height of merely 2.5 mm. Therefore, in order to prevent breakage of the pellicle film 801, the height of the pellicle 800 is preferably 2 mm or less.

In order to prevent dust or the like from being attached to the adhesive layer 843 of the pellicle 800 before use, the adhesive layer 843 is protected by a peelable liner 851.

In this embodiment, the through-hole 821 runs through the pellicle film 801 and the first frame 811 and is in communication with the hole 823 formed by a combination of the groove 825 formed in the second frame 813 and the first frame 811. Thus, the filter 831 is located with a sufficient close-adhesiveness with no gap, other than the through-hole 821, being formed in a rear surface of the filter 831. In this embodiment, the groove 825 is formed in the second frame 813. Thus, the processing is performed more easily than in the case where the groove is formed in the first frame.

(Method for Producing the Pellicle 900)

Unlike with the method for producing the pellicle 700, in a method for producing the pellicle 800, the groove 825 is formed in the second frame 813. In this embodiment, the groove 825, which is to be in communication with the through-hole 821, is formed in the surface of the second frame 813 that faces the first frame 811. The first frame 811 is secured to the second frame 813 with the adhesive layer 841 to communicate the groove 825 with the through-hole 821 and also to form the hole 823 having the opening in the inner surface of the second frame 813. Except for the above, the method for producing the pellicle 800 is substantially the same as that for the pellicle 700, and thus will not be described in detail.

As is clear to a person of ordinary skill in the art, the pellicle in any of the embodiments 7 and 8 described above may be combined with any of embodiments 5 and 6, in which the filter is located such that the top surface of the filter and the top surface of the pellicle film are on the same plane. The pellicle according to the present invention encompasses such embodiments.

Embodiment 9

In the following example, the structure in which the filter 531 is located, adjacent to the pellicle film 501, on the first frame 511 as described in embodiment 5, and the structure in which the second frame 713 has the hole 727 formed therein as described in embodiment 7, are combined together.

Figure 21:
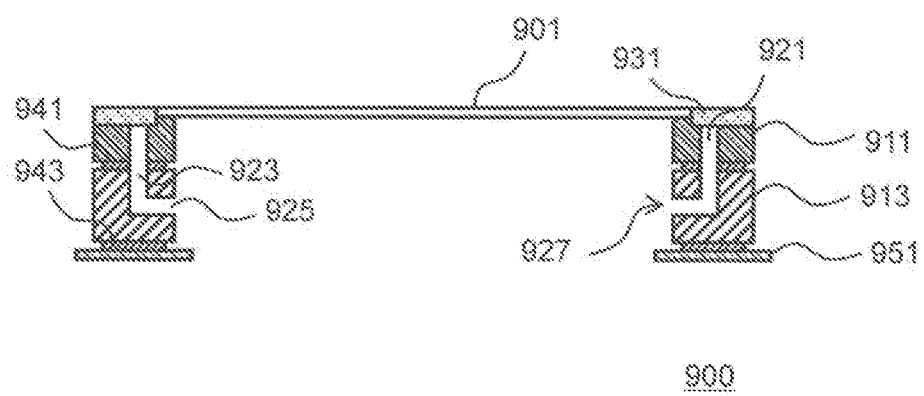
FIG. 21 is a cross-sectional view of a pellicle 900 in an embodiment, taken along line A-A' in FIG. 1.

FIG. 21 is a cross-sectional view of a pellicle 900 in an embodiment according to the present invention, taken along line A-A' in FIG. 1. The pellicle 900 includes a first frame 911 having a pellicle film 901 located thereon, and a second frame 913 supporting the first frame 911. The pellicle 900 also has a through-hole 921 running through the first frame 911, and includes a filter 931 covering the through-hole 921 while being adjacent to the pellicle film 901 on the side of a surface of the first frame 911 on which the pellicle film 901 is located. It is preferable that the filter 931 is located such that a top surface of the filter 931 and a top surface of the pellicle film 901 are on the same plane. The filter 931 is located, with an adhesive layer (not shown), on a region in the first frame 911 where the pellicle film 901 is provided.

The second frame 913 has a first opening 923 located in a surface thereof facing the first frame 911 and a second opening 925 located in an inner surface thereof. The two openings are in communication with each other via a hole 927 located in the second frame 913, and the first opening 923 is in communication with the through-hole 921. Except for the above, the pellicle 900 has substantially the same structure as that of the pellicle described in each of embodiments 5 and 7, and thus will not be described in detail.

In this embodiment, the through-hole 921 runs through the first frame 911 and is in communication with the hole 927 located in the second frame 913. Thus, the filter 931 is located with a sufficient close-adhesiveness with no gap, other than the through-hole 921, being formed in a rear surface of the filter 931. In this embodiment, the hole 927 is formed in the second frame 913. Thus, the processing is performed more easily than in the case where the hole is formed in the first frame. Since the pellicle film 901 is located on the first frame 911, the height of the pellicle 900 is made lower by the thickness of the filter 931.

(Method for Producing the Pellicle 900)

The method for producing the pellicle 900 is substantially the same as the method in embodiment 5 until the through-hole 921 is formed in the surface of the first frame 911 that faces the second frame 913, and thus will not be described in detail. Unlike with the method in embodiment 5, with the method in this embodiment, no groove in communication with the through-hole 921 is formed in the first frame 911. The first opening 923 is formed in the surface of the second frame 913 that faces the first frame 911, the second opening 925 is formed in the inner surface of the second frame 913, the hole 927 communicating the two openings is formed in the second frame 913, and the first opening 923 is communicated with the through-hole 921. Except for the above, the method for producing the pellicle 900 is substantially the same as that for the pellicle 700, and thus will not be described in detail.

Embodiment 10

In the following example, the structure in which the filter 531 is located, adjacent to the pellicle film 501, on the first frame 511 as described in embodiment 5, and the structure in which the second frame 813 has the hole 823 formed therein as described in embodiment 8, are combined together.

Figure 22:
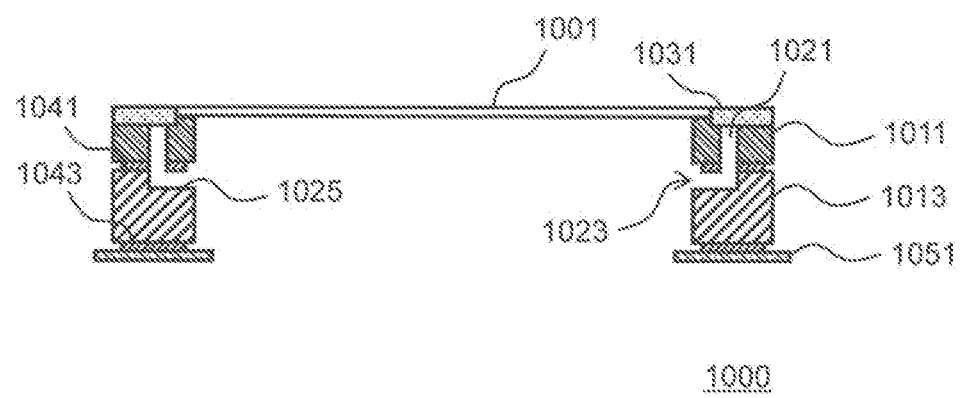
FIG. 22 is a cross-sectional view of a pellicle 1000 in an embodiment, taken along line A-A' in FIG. 1.

FIG. 22 is a cross-sectional view of a pellicle 1000 in an embodiment according to the present invention, taken along line A-A' in FIG. 1. The pellicle 1000 includes a first frame 1011 having a pellicle film 1001 located thereon, and a second frame 1013 supporting the first frame 1011. The pellicle 1000 also has a through-hole 1021 running through the first frame 1011, and includes a filter 1031 covering the through-hole 1021 while being adjacent to the pellicle film 1001 on the side of a surface of the first frame 1011 on which the pellicle film 1001 is located. It is preferable that the filter 1031 is located such that a top surface of the filter 1031 and a top surface of the pellicle film 1001 are on the same plane. The filter 1031 is located, with an adhesive layer (not shown), on a region in the first frame 1011 where the pellicle film 1001 is provided.

The second frame 1013 has a groove 1025, in communication with the through-hole 1021, in a surface thereof facing the first frame 1011. The groove 1025, in combination with the first frame 1011, forms a hole 1023 in communication with the through-hole 1021. The hole 1023 has an opening in an inner surface of the second frame 1013. Except for the above, the pellicle 1000 has substantially the same structure as that of the pellicle described in each of embodiments 5 and 8, and thus will not be described in detail.

In this embodiment, the through-hole 1021 runs through the first frame 1011 and is in communication with the hole 1023 formed by a combination of the groove 1025 formed in the second frame 1013 and the first frame 1011. Thus, the filter 1031 is located with a sufficient close-adhesiveness with no gap, other than the through-hole 1021, being formed in a rear surface of the filter 1031. In this embodiment, the groove 1025 is formed in the second frame 1013. Thus, the processing is performed more easily than in the case where the groove is formed in the first frame. Since the pellicle film 1001 is located on the first frame 1011, the height of the pellicle 1000 is made lower by the thickness of the filter 1031.

(Method for Producing the Pellicle 1000)

The method for producing the pellicle 1000 is substantially the same as the method in embodiment 5 until the through-hole 1021 is formed in the surface of the first frame 1011 that faces the second frame 1013, and thus will not be described in detail. Unlike with the method in embodiment 5, with the method in this embodiment, no groove in communication with the through-hole 1021 is formed in the first frame 1011. The groove 1025, which is to be in communication with the through-hole 1021, is formed in the surface of the second frame 1013 that faces the first frame 1011, the first frame 1011 is secured to the second frame 1023 with an adhesive layer 1041 to communicate the groove 1025 with the through-hole 1021 and also to form the hole 1023 having the opening in the inner surface of the second frame 1013. Except for the above, the method for producing the pellicle 1000 is substantially the same as that for the pellicle 800, and thus will not be described in detail.

In the above-described embodiments, the pellicle film of the pellicle according to the present invention is an unconventionally thin film having a thickness of 20 nm or greater and 50 nm or less. Therefore, it is difficult to secure the pellicle film to a photomask by hand. Thus, the pellicle film needs to be bonded to the photomask in a non-contact manner by use of a dedicated bonding device. In this embodiment, an example in which a bonding element for bonding the pellicle film to the photomask in a non-contact manner is provided in the second frame will be described.

Figure 23:
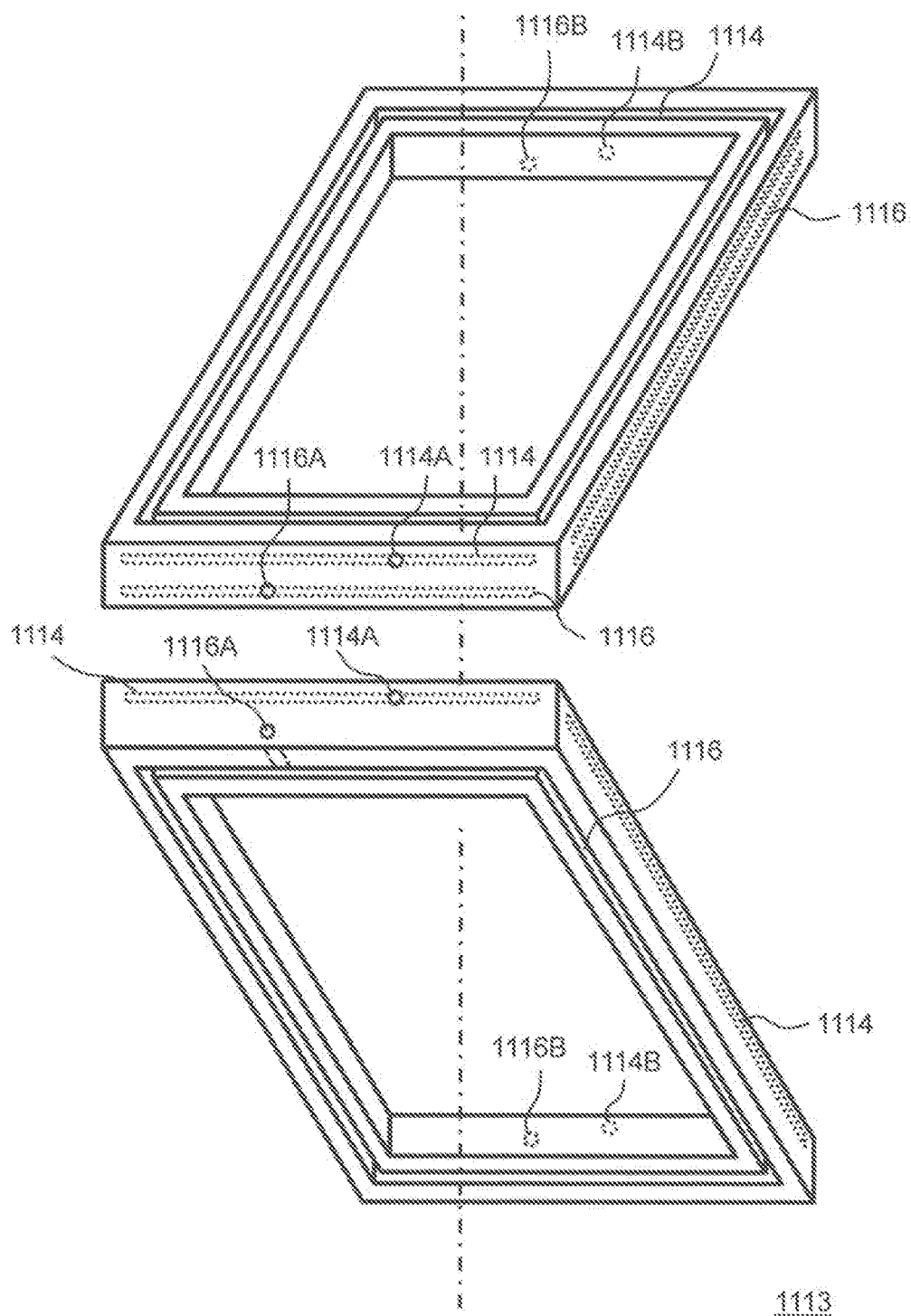
FIG. 23 is a schematic view of a second frame 1113 used for a pellicle 1100 in an embodiment.

FIG. 23 is a schematic view of a second frame 1113 used for a pellicle 1100 in an embodiment according to the present invention. An upper part of the figure shows a perspective view of a top part of the second frame 1113, and a lower part of the figure shows a perspective view of a bottom part of the second frame 1113. The pellicle 1110 includes a first frame 1111 having a pellicle film 1111 located thereon, and a second frame 1113 supporting the first frame 1111. The pellicle 1100 also has a through-hole 1121 running through the pellicle film 1101 and the first frame 1111, and includes a filter 1131 covering the through-hole 1121. The filter 1131 is located, with an adhesive layer (not shown), on a surface of the frame 1111 on which the pellicle film 1101 is located.

The second frame 1113 has a groove 1114 formed in a top surface thereof. In this embodiment, as seen from the top surface (in a thick direction) of the second frame 1113, the groove 1114 has a shape running around the shape of the second frame 1113 with no end.

The second frame 1113 has a through-hole 1114A and a through-hole 1114B. The through-hole 1114A and the through-hole 1114B each run from a bottom surface of the groove 1114 through an outer surface of the second frame 1113.

The through-holes 1114A and 1114B may each run from a side surface of the groove 1114 through the outer surface of the second frame 1113. Alternatively, either one of the through-holes 1114A and 1114B may be omitted. Namely, in the second frame 1113, two through-holes (through-holes 1114A and 1114B) are in communication with one groove (groove 1114), but this embodiment is not limited to having such a structure. In this embodiment, it is sufficient that at least one through-hole is in communication with one groove (groove 1114, groove 1116).

As shown in FIG. 23, the second frame 1113 has a groove 1116 on a bottom surface opposite to the top surface thereof. In this embodiment, the groove 1116 also has a shape running around the shape of the second frame 1113 with no end as seen in the thick direction, like the groove 1114.

The second frame 1113 has a through-hole 1116A and a through-hole 1116B. The through-hole 1116A and the through-hole 1116B each run from a bottom surface of the groove 1116 through the outer surface of the second frame 1113. The through-holes 1116A and 1116B may have variations substantially the same as those of the through-holes 1114A and 1114B.

The second frame 1113 is preferable to secure (support) the pellicle film 1101 and the first frame 1111 to produce the pellicle 1100. The second frame 1113 has the groove 1114 in the top surface thereof facing the first frame 1111, and also has the through-holes 1114A and 1114B in communication with the groove 1114. Therefore, for securing the first frame 1111 to the second frame 1113, the inside of the groove 1114 is depressurized (by, for example, a discharge element such as a vacuum pump or the like) via the through-holes 1114A and 1114B. Thus, the pressure between the second frame 1113 and the first frame 1111 is decreased. This depressurization causes a mutual pressing force toward the second frame 1113 and the first frame 1111. As a result, the second frame 1113 and the first frame 1111 are secured to each other with nothing contacting a front surface or a rear surface of the second frame 1113 or the first frame 1111 (i.e., the top surface or the bottom surface of the second frame 1113, or the surface of the first frame 1111 on which the pellicle film 1101 is located or a bottom surface of the first frame 1111).

The second frame 1113 and the first frame 1111 are secured to each other with an adhesive layer 1141. Since the second frame 1113 and the pellicle film 1101 are pressed to each other with the adhesive layer 1141 by depressurization, the second frame 1113 and the first frame 1111 are secured to each other firmly.

Except for the above, the pellicle 1100 has substantially the same structure as described in embodiment 1, and thus will not be described in detail. With reference to FIG. 23, the first frame 1111 is substantially the same as the first frame 111 described in embodiment 1. This embodiment is applicable to the second frame engaged with the first frame described in any of embodiments 2 through 8.

(Method for Producing the Pellicle 1100)

The method for producing the pellicle 1100 in this embodiment is basically substantially the same as that in embodiment 1. Like in embodiment 1, the first frame 1111 is formed.

Separately from the above, the second frame 1113 is prepared. The groove 1114 is formed in a top surface of the second frame 1113, and the through-holes 1114A and 1114B running from the side surface of the groove 1114 through the outer surface of the second frame 1113 are formed. Similarly, the groove 1116 is formed in the bottom surface of the second frame 1113, and the through-holes 1116A and 1116B running from the side surface of the groove 1116 through the outer surface of the second frame 1113 are formed.

An adhesive layer 1143 is formed on the bottom surface of the second frame 1113. In this step, the adhesive layer 1143 is formed so as not to cover the groove 1116 formed in the bottom surface of the second frame 1113. A liner 1151 protecting the adhesive layer 1143 is also located. In this step, the liner 1151 having the adhesive layer 1143 formed thereon may be prepared and bonded to the bottom surface of the second frame 1113 such that the liner 1151 is bonded to bottom surface with the adhesive layer 1143.

The adhesive layer 1141 is formed on the top surface of the second frame 1113. In this step, the adhesive layer 1141 is formed so as not to cover the groove 1114 formed in the top surface of the second frame 1113. The first frame 1111 is secured to the second frame 1113 with the formed adhesive layer 1141. The space for attaching the pellicle to the photomask has a height of merely 2.5 mm. Therefore, in this embodiment, it is preferable that the total of the height of the second frame 1113 and the height of the adhesive layer 1143 located on the bottom surface of the second frame 1113 is 2 mm or less.

Figure 24:
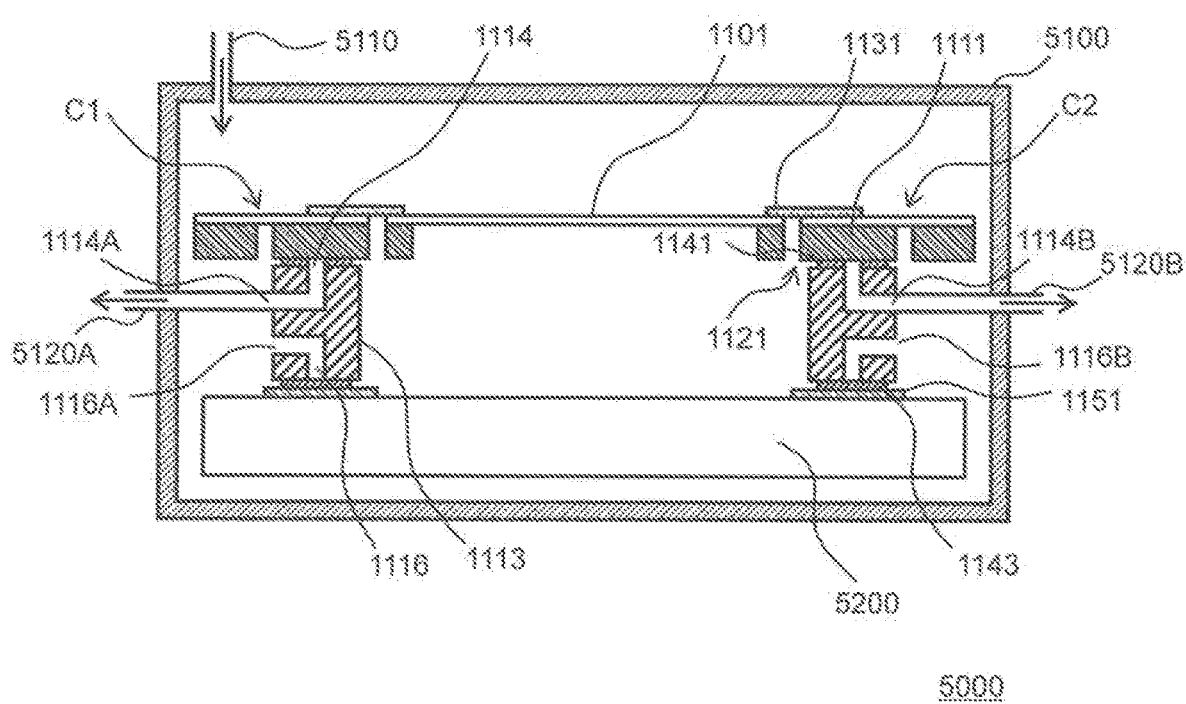
FIG. 24 is a cross-sectional view conceptually showing a pellicle production device 5000 in an embodiment.

The step of securing the first frame 1111 to the second frame 1113 is performed by use of, for example, a pellicle production device 5000 shown in FIG. 24. The pellicle production device 5000 includes a vacuum chamber 5100, a table 5200 located in the vacuum chamber 5100, a supply tube 5110 usable to supply gas to the vacuum chamber 5100, and discharge tubes 5120A and 5120B usable to discharge the gas in the vacuum chamber 5100 to the outside of the vacuum chamber 5100. Ends (not shown), of the discharge tubes 5120A and 5120B, that are outside the vacuum chamber 5100 are connected with a discharge element (not shown) such as a vacuum pump or the like.

On the table 5200 in the vacuum chamber 5100, the second frame 1113 is placed. In more detail, the second frame 1113 is placed such that the liner 1151 of the second frame 1113 is in contact with the table 5200. On the adhesive layer 1141 of the second frame 1113, an assembly of the pellicle film 1101 and the first frame 1111 is located.

In an example, the assembly includes the first frame 1111, which is a silicon wafer (e.g., 8-inch silicon wafer), and the pellicle film 1101, which is a polycrystalline silicon film (p-Si film). At a predetermined position in the assembly, cuts C1 and C2 are provided to be used to cut the first frame 1111 into a predetermined size. Preferably, the first frame 1111 is cut into a predetermined size before being bonded with the second frame 1113 (hereinafter, this operation will be referred to also as "trimming").

The discharge tubes 5120A and 5120B have ends thereof in the vacuum chamber 5100. These ends are connectable into the two through-holes 1114A and 1114B provided to depressurize the inside of the groove 1114 of the second frame 1113.

Hereinafter, an example of method for producing the pellicle by use of the pellicle production device 5000 will be described. First, on the table 5200 in the vacuum chamber 5100, the second frame 1113 is placed. The first frame 1111 is located above the second frame 1113. On this stage, the first frame 1111 is located such that the adhesive layer 1141 and the first frame 1111 do not contact each other.

Next, the second frame 1113 and the first frame 1111 are positioned by a known measure. The positioning is performed such that the first frame 1111 is fit into an opening enclosed by the second frame 1113. Next, the ends of the discharge tubes 5120A and 5120B are respectively connected into the two through-holes 1114A and 1114B provided to depressurize the inside of the groove 1114 of the second frame 1113 (frame main body).

Next, the above-described trimming is performed; namely, the assembly of the first frame 1111 and the pellicle film 1101 is cut at the cuts C1 and C2 such that the assembly has a size same as that of the second frame 1113.

Next, gas is supplied from the supply tube 5110 to the vacuum chamber 5100 to pressurize the inside of the vacuum chamber 5100. At the same time, the vacuum pump (not shown) connected to the ends of the discharge tubes 5120A and 5120B outside the vacuum chamber 5100 is actuated to depressurize the inside of the groove 1114 provided in the top surface of the second frame 1113, via the discharge tubes 5120A and 5120B and the two through-holes 1114A and 1114B of the second frame 1113. The degree of pressurization and depressurization is adjusted such that the mutual pressing force toward the first frame 1111 and the second frame 1113 (force applied to the entirety of the second frame 1113), which is caused by a difference between the entire inner pressure of the vacuum chamber 5100, and the inner pressure of the groove 1114, (i.e., differential pressure) is, for example, about 2 N. The above-described differential pressure causes the mutual pressing force toward the first frame 1111 and the second frame 1113, and the adhesive layer 1143 of the second frame 1113 and the first frame 1111 are bonded to each other.

As described above, the first frame 1111 and the second frame 1113 are secured to each other with nothing contacting the front surface or the rear surface of the second frame 1113 or the first frame 1111. The order of the operations may be exchanged appropriately.

(Method for Locating the Pellicle on the Photomask)

A method for locating the pellicle on the photomask in this embodiment includes, for example, a locating step of locating the pellicle 1100 in this embodiment having the groove 1116 provided in the surface, of the second frame 1113, that is opposite to at least the surface of the first frame 1111 on which the pellicle film 1101 is located, and a photomask, such that the surface of the second frame 1113 in which the groove 1116 is provided faces the photomask; and a securing step of securing the pellicle 1100 and the photomask to each other by depressurizing the inside of the groove 1116 via the through-holes 1116A and 1116B.

With the method for locating the pellicle on the photomask in this embodiment, the depressurization of the inside of the groove 1116 causes a mutual pressing force toward the pellicle 1100 and the photomask. Therefore, the pellicle 1100 and the photomask are secured to each other with nothing contacting a front surface or a rear surface of the pellicle 1100 or the photomask.

With the method for locating the pellicle on the photomask in this embodiment, the depressurization in the securing step is preferably performed in a state where the pellicle 1100 and the photomask are in a pressurizing atmosphere. In such a state, the difference between the pressure of the entire atmosphere in which the pellicle 1100 and the photomask are located, and the inner pressure of the groove 1116, (i.e., differential pressure) is increased. Therefore, the mutual pressing force toward the pellicle 1100 and the photomask is increased. Thus, the pellicle 1100 and the photomask are secured to each other more easily.

The mutual pressing force toward the pellicle 1100 and the photomask (force applied to the entirety of the second frame 1113) is preferably 1 N or greater, and more preferably 2 N or greater. The mutual pressing force toward the pellicle 1100 and the photomask (force applied to the entirety of the second frame 1113) is still more preferably 10 N or greater, and especially preferably 20 N or greater. There is no specific upper limit on the mutual pressing force toward the pellicle 1100 and the photomask (force applied to the entirety of the second frame 1113). From the point of view of productivity or the like, the upper limit of the mutual pressing force is, for example, 500 N, preferably 400 N.

Figure 25:
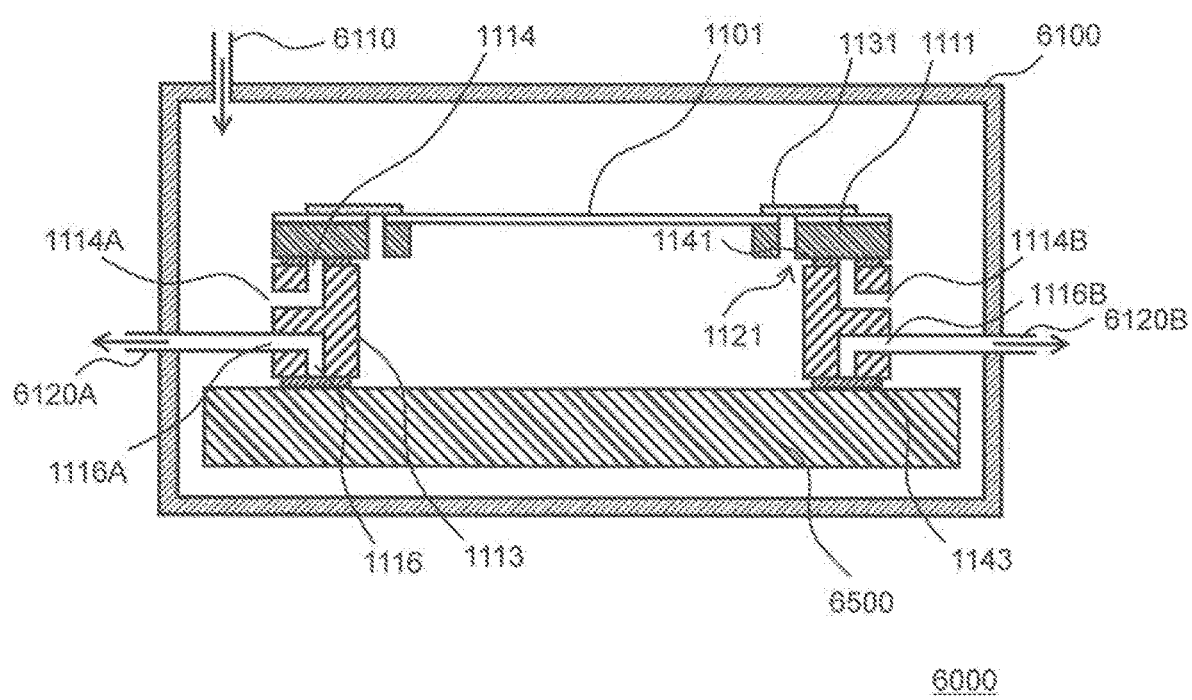
FIG. 25 is a cross-sectional view conceptually showing a photomask production device 6000 in an embodiment.

Now, an example of method for locating the pellicle on the photomask in this embodiment will be described with reference to FIG. 25. It should be noted that the method for locating the pellicle on the photomask in this embodiment is not limited to this example. FIG. 25 is a cross-sectional view conceptually showing an example of photomask production device preferable for the method for locating the pellicle on the photomask.

A photomask production device 6000 shown in FIG. 25 includes a vacuum chamber 6100, a supply tube 6110 usable to supply gas to the vacuum chamber 6100, and discharge tubes 6120A and 6120B usable to discharge the gas in the vacuum chamber 6100 to the outside of the vacuum chamber 6100. Ends (not shown), of the discharge tubes 6120A and 6120B, that are outside the vacuum chamber 6100 are connected with a discharge element (not shown) such as a vacuum pump or the like.

In the vacuum chamber 6100, a photomask 6500 is located. The photomask 6500 includes a support substrate, a reflective layer stacked on the support substrate, and an absorber layer formed on the reflective layer. The photomask 6500 is located in the vacuum chamber 6100 such that a front surface (light exposure surface; i.e., surface at which the reflective layer and the absorber layer are provided) is directed upward and a rear surface (surface opposite to the light exposure surface; i.e., the surface on the side of the support substrate) is directed downward.

The pellicle 1100 deprived of the liner 1151 is located above the reflective layer and the absorber layer of the photomask 6500. In more detail, the pellicle 1100 is located such that the adhesive 1143 side of the pellicle 1100 faces the front surface (light exposure surface) of the photomask 6500.

The discharge tubes 6120A and 6120B have ends in the vacuum chamber 6100. These ends are connectable into the two through-holes provided to depressurize the inside of the groove 1116 provided in the bottom surface of the second frame 1113.

Hereinafter, an example of method for locating the pellicle on the photomask by use of the photomask production device 6000 will be described. First, the pellicle 1100 in the state where the liner 1151 is removed is prepared. Then, the photomask 6500 is located in the vacuum chamber 6100 such that the front surface (light exposure surface) is directed upward. In this step, in order to prevent any foreign object from being attached to the front surface or the rear surface of the photomask 6500, only a side surface, for example, of the photomask 6500 is supported, so that any device, jig or hand does not contact the front surface or the rear surface of the photomask 6500.

Next, the pellicle 1100 is located above the photomask 6500. In this step, in order to prevent any foreign object from being attached to the film surface of the pellicle 1100, only the side surface (outer circumferential surface), for example, of the second frame 1113 is supported, so that any device, jig or hand does not contact the film surface of the pellicle 1100. On this stage, the pellicle 1100 is located such that the adhesive layer 1143 and the photomask 6500 do not contact each other. Next, the pellicle 1100 and the photomask 6500 are positioned by a known measure.

Next, the ends of the discharge tubes 6120A and 6120B are respectively connected into the two through-holes provided to depressurize the inside of the groove 1116 on the bottom side of the second frame 1113. Next, gas is supplied from the supply tube 6110 to the vacuum chamber 6100 to pressurize the inside of the vacuum chamber. At the same time, the vacuum pump (not shown) connected to the ends of the discharge tubes 6120A and 6120B outside the vacuum chamber 6100 is actuated to depressurize the inside of the groove 1116 provided in the bottom surface of the second frame 1113, via the discharge tubes 6120A and 6120B and the two through-holes 1116A and 1116B of the second frame 1113. The degree of pressurization and depressurization is adjusted such that the mutual pressing force toward the pellicle 1100 and the photomask 6500 (force applied to the entirety of the second frame 1113), which is caused by a difference between the entire inner pressure of the vacuum chamber 6100 and the inner pressure of the groove 1116, (i.e., differential pressure) is, for example, about 2 N. The above-described differential pressure causes the mutual pressing force toward the pellicle 1100 and the photomask 6500, and the adhesive layer 1143 of the pellicle 1100 and the photomask 6500 are bonded to each other.

As described above, the pellicle 1100 and the photomask 6500 are bonded to each other with nothing contacting the front surface or the rear surface of the pellicle 1100 or the photomask 6500. Thus, the pellicle 1100 and the photomask 6500 are bonded to each other while any foreign object is suppressed from being attached to the pellicle 1100 or the photomask 6500. The order of the operations may be exchanged appropriately.

(Modification of the Method for Locating the Pellicle to the Photomask)

With the above-described method for locating the pellicle on the photomask, after the first frame 1111 and the second frame 1113 are bonded to each other to produce the pellicle 1100, the pellicle 1100 is located on the photomask 6500. The method for locating the pellicle on the photomask according to the present invention is not limited to this. The orders of the operations are exchangeable. An example in which after the second frame is located on the photomask, the first frame is bonded to the second frame to produce the pellicle will be described.

In this embodiment, the method for locating the pellicle on the photomask includes a locating step of locating the second frame 1113 having the groove 1116 provided in the surface opposite to the surface supporting the first frame 1111 on which the pellicle film 1101 is located, and a photomask, such that the surface, of the second frame 1113, in which the groove 1116 is provided faces the photomask; a securing step of securing the pellicle 1100 and the photomask to each other by depressurizing the inside of the groove 1116 via the through-holes 1116A and 1116B, and a step of securing the first frame 1111 having the pellicle film 1101 located thereon to the second frame 1113.

As described above in embodiment 9, the second frame 1113 supports the first frame 1111 having the pellicle film 1101 located thereon. The second frame 1113 has the groove 1114 formed in the top surface thereof, the through-holes 1114A and 1114B running from the bottom surface of the groove 1114 through the outer surface of the second frame 1113, the groove 1116 provided in the bottom surface opposite to the top surface thereof, and the through-holes 1116A and 1116B running from the bottom surface of the groove 1116 through the outer surface of the second frame 1113.

With the method for locating the pellicle on the photomask in this embodiment, the depressurization of the inside of the groove 1116 causes a mutual pressing force toward the second frame 1113 and the photomask. Therefore, the second frame 1113 and the photomask are secured to each other with the adhesive layer 1143 with nothing contacting the front surface or the rear surface of the second frame 1113 or the photomask.

With the method for locating the pellicle on the photomask in this embodiment, the depressurization in the step of securing the second frame 1113 is preferably performed in a state where the second frame 1113 and the photomask are in a pressurizing atmosphere. In such a state, the difference between the pressure of the entire atmosphere in which the second frame 1113 and the photomask are located, and the inner pressure of the groove 1116, (i.e., differential pressure) is increased. Therefore, the mutual pressing force toward the second frame 1113 and the photomask is increased. Thus, the second frame 1113 and the photomask are secured to each other more easily.

The mutual pressing force toward the second frame 1113 and the photomask is preferably 1 N or greater, and more preferably 2 N or greater. The mutual pressing force toward the second frame 1113 and the photomask is still more preferably 10 N or greater, and especially preferably 20 N or greater. There is no specific upper limit on the mutual pressing force toward the second frame 1113 and the photomask. From the point of view of productivity or the like, the upper limit of the mutual pressing force is, for example, 500 N, preferably 400 N.

The pressure between the second frame 1113 and the first frame 1111 is decreased by depressurizing the inside of the groove 1114 (by, for example, a discharge element such as a vacuum pump or the like) via the through-holes 1114A and 1114B. The depressurization causes a mutual pressing force toward the second frame 1113 and the first frame 1111. As a result, the first frame 1111 and the second frame 1113 are secured to each other with noting contacting the front surface or the rear surface of the second frame 1113 or the first frame 1111 (i.e., the top surface or the bottom surface of the second frame 1113, or the surface of the first frame 1111 on which the pellicle film 1101 is located or a bottom surface of the first frame 1111).

The second frame 1113 and the first frame 1111 are secured to each other with the adhesive layer 1141. Since the second frame 1113 and the pellicle film are pressed to each other with the adhesive layer 1141 by depressurization, the second frame 1113 and the first frame 1111 are secured to each other firmly.

Figure 26A:
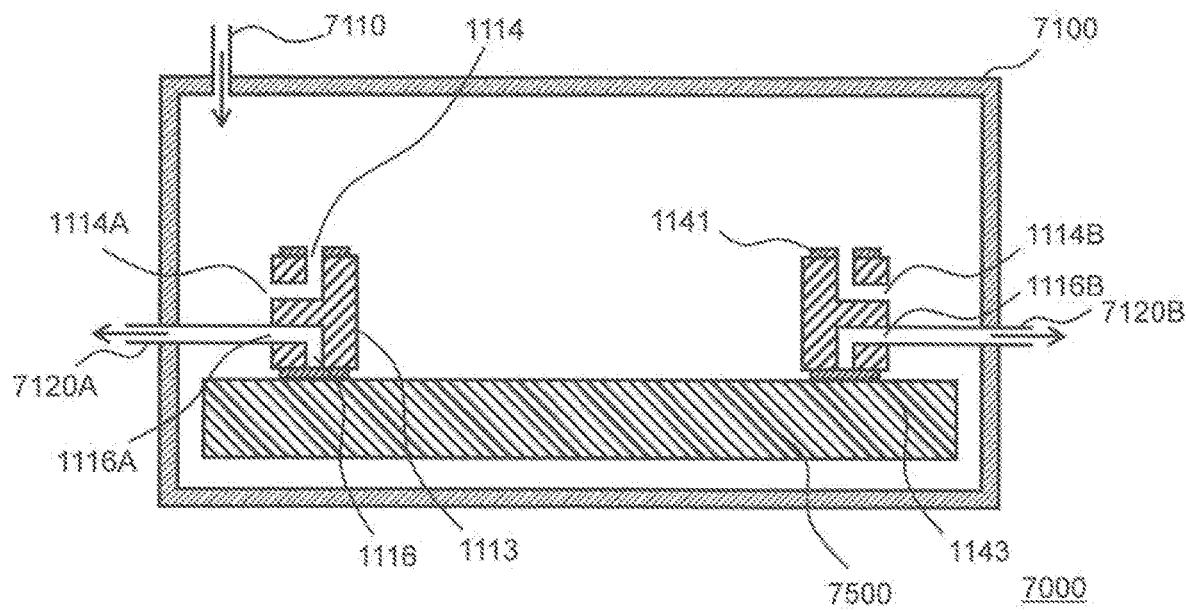
FIG. 26A provides cross-sectional views conceptually showing a photomask production device 7000 in an embodiment.
Figure 26B:
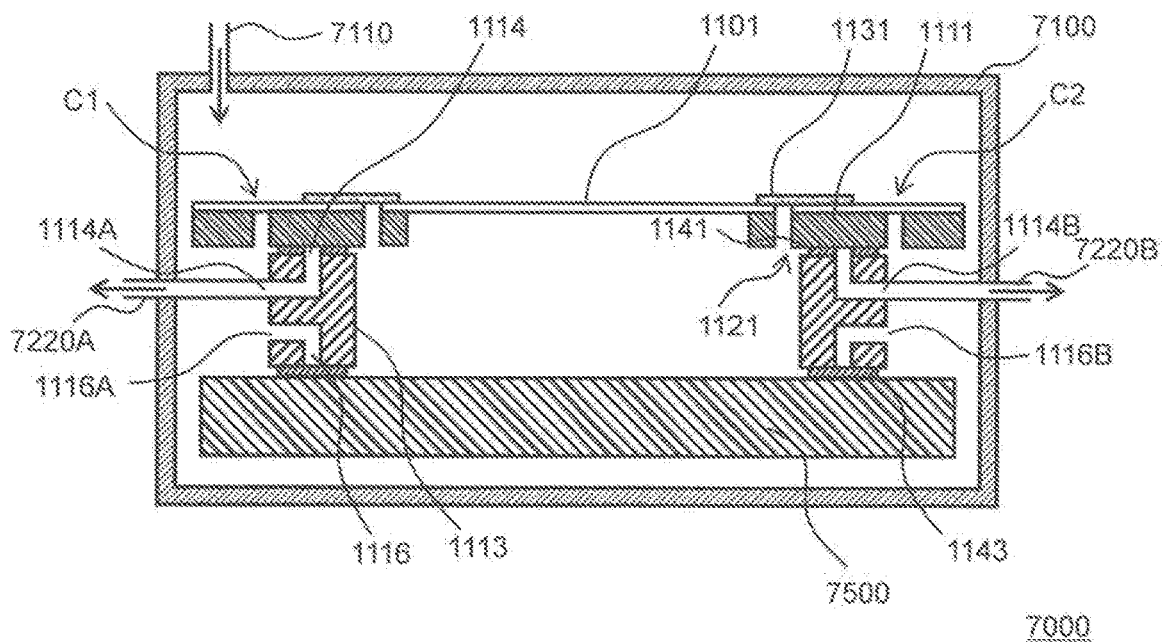
FIG. 26B provides cross-sectional views conceptually showing a photomask production device 7000 in an embodiment.

Now, a modification of the method for locating the pellicle on the photomask in this embodiment will be described with reference to FIGS. 26A and 26B. It should be noted that the method for locating the pellicle on the photomask in this embodiment is not limited to this example. FIGS. 26A and 26B provide cross-sectional views conceptually showing an example of photomask production device 7000 preferable for the method for locating the pellicle on the photomask.

The photomask production device 7000 shown in FIGS. 26A and 26B includes a vacuum chamber 7100, a supply tube 7110 usable to supply gas to the vacuum chamber 7100, and discharge tubes 7120A, 7120B, 7220A and 7220B usable to discharge the gas in the vacuum chamber 7100 to the outside of the vacuum chamber 7100. Ends (not shown), of the discharge tubes 7120A, 7120B, 7220A and 7220B that are outside the vacuum chamber 7100 are connected with a discharge element (not shown) such as a vacuum pump or the like.

In the vacuum chamber 7100, a photomask 7500 is located. The photomask 7500 includes a support substrate, a reflective layer stacked on the support substrate, and an absorber layer formed on the reflective layer. The photomask

7500 is located in the vacuum chamber 7100 such that a front surface (light exposure surface; i.e., surface at which the reflective layer and the absorber layer are provided) is directed upward and a rear surface (surface opposite to the light exposure surface; i.e., the surface on the side of the support substrate) is directed downward.

The second frame 1113 deprived of the liner 1151 is located above the reflective layer and the absorber layer of the photomask 7500. In more detail, the second frame 1113 is located such that the adhesive 1143 side of the second frame 1113 faces the front surface (light exposure surface) of the photomask 7500.

The discharge tubes 7120A and 7120B have ends in the vacuum chamber 7100. These ends are connectable into the two through-holes provided to depressurize the inside of the groove 1116 provided in the bottom surface of the second frame 1113.

Hereinafter, an example of method for locating the pellicle on the photomask by use of the photomask production device 7000 will be described. First, the second frame 1113 in the state where the liner 1151 is removed is prepared. Then, the photomask 7500 is located in the vacuum chamber 3100 such that the front surface (light exposure surface) is directed upward. In this step, in order to prevent any foreign object from being attached to the front surface or the rear surface of the photomask 7500, only a side surface, for example, of the photomask 7500 is supported, so that any device, jig or hand does not contact the front surface or the rear surface of the photomask 7500.

Next, the second frame 1113 is located above the photomask 7500. On this stage, the second frame 1113 is located such that the adhesive layer 1143 and the photomask 7500 do not contact each other. Next, the second frame 1113 and the photomask 7500 are positioned by a known measure.

Next, the ends of the discharge tubes 7120A and 7120B are respectively connected into the two through-holes provided to depressurize the inside of the groove 1116 on the bottom side of the second frame 1113. Next, gas is supplied from the supply tube 7110 to the vacuum chamber 7100 to pressurize the inside of the vacuum chamber 7100. At the same time, the vacuum pump (not shown) connected to the ends of the discharge tubes 7120A and 7120B outside the vacuum chamber 7100 is actuated to depressurize the inside of the groove 1116 provided in the bottom surface of the second frame 1113, via the discharge tubes 7120A and 7120B and the two through-holes 1116A and 1116B of the second frame 1113. The degree of pressurization and depressurization is adjusted such that the mutual pressing force toward the second frame 1113 and the photomask 7500, which is caused by a difference between the entire inner pressure of the vacuum chamber 7100 and the inner pressure of the groove 1116, (i.e., differential pressure) is, for example, about 2 N. The above-described differential pressure causes the mutual pressing force toward the second frame 1113 and the photomask 7500, and the adhesive layer 1143 of the pellicle 1100 and the photomask 7500 are bonded to each other (FIG. 26A).

Next, the first frame 1111 is located above the second frame 1113. On this stage, the first frame 1111 is located such that the adhesive layer 1141 and the first frame 1111 do not contact each other. Next, the second frame 1113 and the first frame 1111 are positioned by a known measure. The positioning is performed such that the first frame 1111 is fit into an opening enclosed by the second frame 1113. Next, ends of discharge tubes 7220A and 7220B are respectively connected into the two through-holes 1114A and 1114B provided to depressurize the inside of the groove 1114 of the second frame 113 (frame main body).

Next, gas is supplied from the supply tube 7110 to the vacuum chamber 7100 to pressurize the inside of the vacuum chamber 7100. At the same time, the vacuum pump (not shown) connected to the ends of the discharge tubes 7220A and 7220B outside the vacuum chamber 7100 is actuated to depressurize the inside of the groove 1114 provided in the top surface of the second frame 1113, via the discharge tubes 7220A and 7220B and the two through-holes 1114A and 1114B of the second frame 1113. The degree of pressurization and depressurization is adjusted such that the mutual pressing force toward the first frame 1111 and the second frame 1113 (force applied to the entirety of the second frame 1113), which is caused by a difference between the entire inner pressure of the vacuum chamber 7100 and the inner pressure of the groove 1114, (i.e., differential pressure) is, for example, about 2 N. The above-described differential pressure causes the mutual pressing force toward the first frame 1111 and the second frame 1113, and the adhesive layer 1141 of the second frame 1113 and the first frame 1111 are bonded to each other (FIG. 26B).

Next, the above-described trimming is performed; namely, the assembly of the first frame 1111 and the pellicle film 1101 is cut at the cuts C1 and C2 such that the assembly has a size same as that of the second frame 1113.

As described above, the pellicle 1100 and the photomask 7500 are bonded to each other with nothing contacting the front surface or the rear surface of the pellicle 1100 or the photomask 7500. Thus, the pellicle 1100 and the photomask 7500 are bonded to each other while any foreign object is suppressed from being attached to the pellicle 1100 or the photomask 7500. The order of the operations may be exchanged appropriately.

(Exposure Method)

The pellicle in any of the embodiments described above may be used to realize microscopic processing by extreme ultraviolet lithography. The pellicle according to the present invention is located on a reticle surface of the photomask, and the photomask is located at a predetermined position in the exposure device. The pellicle is caused to be accommodated in a gap having a distance of 3 mm or less from the reticle surface. In vacuum, light of 5 nm or longer and 30 nm or shorter is directed toward the photomask having the pellicle located thereon, and light output from the reticle surface of the photomask having the pellicle located thereon is directed toward a substrate on which a resist layer is formed. Thus, a pattern is exposed to the resist layer.

The pellicle film of the pellicle according to the present invention is an unconventionally thin film having a thickness of 20 nm or greater and 50 nm or less. Therefore, it is difficult to secure the pellicle to a photomask by hand like a conventional pellicle. Thus, a dedicated bonding device is needed to bond the pellicle to the photomask in a non-contact manner.

The photomask having the pellicle bonded thereto according to the present invention is located at a predetermined position in the exposure device. The pellicle is accommodated in a gap having a distance of 3 mm or less, especially 2.5 mm, from the reticle surface.

The substrate having the resist layer formed thereon is introduced into the exposure device, and the inside of the exposure device is put into a vacuum state of about $10^{-4}$ to about $10^{-6}$ Pa. At this point, air flows out from the pellicle, according to the present invention, bonded to the photomask. As described above, the pellicle according to the present invention includes the second frame having an L-shaped cross-section, and the height of the filter is made approximately equal to the height of the second frame. Thus, the filter is located with a sufficient adhesiveness with no gap, other than the through-hole, being formed in a rear surface of the filter. Therefore, the inside of the pellicle is put into a vacuum state with no damage on the pellicle film.

Then, EUV light of 5 nm or longer and 30 nm or shorter is directed toward the photomask having the pellicle located thereon. The photomask includes a multi-layer reflective film below the reticle surface. Therefore, the EUV light incident on the reticle surface is reflected by the multi-layer reflective film, and the EUV light reflecting the pattern formed at the absorber at the reticle surface is transmitted from the reticle surface through the pellicle and thus is output.

The light output from the reticle surface of the photomask is directed toward the substrate having a resist layer formed thereon, and thus the pattern is exposed to the resist layer. As a result, unconventionally microscopic processing is realized.

The present invention provides a pellicle for extreme ultraviolet light lithography, a production method thereof, and an exposure method. The present invention also provides a pellicle for extreme ultraviolet light lithography that is bondable to a photomask in a non-contact manner, and a production method thereof.

The invention claimed is:

1. A pellicle, comprising:
   a first frame directly contacting a pellicle film located thereon;
   a second frame supporting the first frame;
   a through-hole running through the first frame; and
   a filter including a gas passage portion and a bonding portion on which an adhesive layer is located, the gas passage portion being not in contact with the adhesive layer, the bonding portion being provided along a periphery of the filter so as to enclose the gas passage portion, and the filter covering the through-hole via the adhesive layer on the side of a surface of the first frame on which the pellicle film is located,
   wherein the pellicle film has a transmittance of 90.0% or greater with respect to light having a wavelength of 13.5 nm,
   a ratio of a total area size of the gas passage portion of the filter with respect to an inner volume of the pellicle is 0.007 $mm^{-1}$ or greater and 0.026 $mm^{-1}$ or less, and
   the total of the height of the pellicle and the thickness of the filter is less than 2.5 mm.

2. The pellicle according to claim 1, wherein:
   the through-hole runs through the pellicle film; and
   the filter is located on the pellicle film.

3. The pellicle according to claim 1, wherein the filter is located, adjacent to the pellicle film, on the first frame.

4. The pellicle according to claim 3, wherein the filter is located on the first frame such that a top surface of the filter and a top surface of the pellicle film are on the same plane.

5. The pellicle according to claim 1, wherein:
   the first frame has a groove in a surface thereof facing the second frame, the groove being in communication with the through-hole;
   the groove, in combination with the second frame, forms a hole in communication with the through-hole; and
   the hole has an opening in an inner surface of the first frame.

6. The pellicle according to claim 1, wherein:
   the second frame has a first opening located in a surface thereof facing the first frame, and also has a second opening located in an inner surface thereof;
   the two openings are in communication with each other via a hole located in the second frame; and
   the first opening is in communication with the through-hole.

7. The pellicle according to claim 1, wherein:
   the second frame has a groove in a surface thereof facing the first frame, the groove being in communication with the through-hole;
   the groove, in combination with the first frame, forms a hole in communication with the through-hole; and
   the hole has an opening in an inner surface of the second frame.

8. The pellicle according to claim 1, wherein the pellicle film has a thickness of 20 nm or greater and 50 nm or less.

9. An exposure method, comprising:
   locating a pellicle according to claim 1 on a reticle surface of a photomask;
   locating the photomask at a predetermined position in an exposure device and causing the pellicle to be accommodated in a gap having a distance of 3 mm or less from the reticle surface;
   directing, in vacuum, light having a wavelength of 13.5 nm toward the photomask having the pellicle located thereon; and
   exposing light output from the reticle surface of the photomask having the pellicle located thereon toward a substrate having a resist layer formed thereon.

10. A method for producing a pellicle, comprising:
    forming a pellicle film on a substrate;
    removing a part of the pellicle film at a predetermined position to expose the substrate;
    removing a part of the substrate to expose the pellicle film, thereby forming a first frame and forming a through-hole running through the first frame, the through-hole being formed at the predetermined position, the first frame directly contacting the pellicle film;
    locating a filter, covering the through-hole via a first adhesive layer, on the side of a surface of the first frame on which the pellicle film is located so that a gas passage portion is formed, and the gas passage portion being enclosed by a bonding portion on which the first adhesive layer is located and being not in contact with the first adhesive layer; and
    securing the first frame to a second frame with a second adhesive layer so as to open the through-hole on the side of the first frame,
    wherein the pellicle film has a transmittance of 90.0% or greater with respect to light having a wavelength of 13.5 nm,
    a ratio of a total area size of the gas passage portion of the filter with respect to an inner volume of the pellicle is 0.007 $mm^{-1}$ or greater and 0.026 $mm^{-1}$ or less, and
    the total of the height of the pellicle and the thickness of the filter is less than 2.5 mm.

11. The method for producing a pellicle according to claim 10, wherein:
    the through-hole is formed at the predetermined position to run through the pellicle film; and
    the filter covering the through-hole is located on the pellicle film.

12. The method for producing a pellicle according to claim 10, wherein the filter is located, adjacent to the pellicle film, on the first frame.

13. The method for producing a pellicle according to claim 12, wherein the filter is located on the first frame such that a top surface of the filter and a top surface of the pellicle film are on the same plane.

14. The method for producing a pellicle according to claim 10, further comprising forming a groove, to be in communication with the through-hole, in a surface of the first frame that faces the second frame;
- wherein the first frame is secured to the second frame with the second adhesive layer to communicate the groove with the through-hole and to form a hole having an opening in an inner surface of the first frame.

15. The method for producing a pellicle according to claim 10, further comprising:
- forming a first opening in a surface of the second frame that faces the first frame;
- forming a second opening in an inner surface of the second frame;
- forming a hole in the second frame, the hole communicating the two openings; and
- communicating the first opening with the through-hole.

16. The method for producing a pellicle according to claim 10, further comprising forming a groove, to be in communication with the through-hole, in a surface of the second frame that faces the first frame;
- wherein the first frame is secured to the second frame with the second adhesive layer to communicate the groove with the through-hole and to form a hole having an opening in an inner surface of the second frame.

17. The method for producing a pellicle according to claim 10, wherein:
- the pellicle film is formed on the substrate so as to have a thickness of 20 nm or greater or 50 nm or less.

* * * * *